(12) United States Patent
Paquelet et al.

(10) Patent No.: US 11,652,472 B2
(45) Date of Patent: May 16, 2023

(54) DIGITAL INTERPOLATION FILTER, CORRESPONDING RHYTHM CHANGING DEVICE AND RECEIVING EQUIPMENT

(71) Applicant: B-COM, Cesson-Sévigné (FR)

(72) Inventors: Stéphane Paquelet, Rennes (FR); Ali Zeineddine, Cesson-Sévigné (FR)

(73) Assignee: B-COM, Cesson-Sevigne (FR)

( * ) Notice: Subject to any disclaimer, the term of this patent is extended or adjusted under 35 U.S.C. 154(b) by 114 days.

(21) Appl. No.: 16/956,159

(22) PCT Filed: Dec. 10, 2018

(86) PCT No.: PCT/EP2018/084244
§ 371 (c)(1),
(2) Date: Jun. 19, 2020

(87) PCT Pub. No.: WO2019/121122
PCT Pub. Date: Jun. 27, 2019

(65) Prior Publication Data
US 2021/0111707 A1    Apr. 15, 2021

(30) Foreign Application Priority Data

Dec. 20, 2017   (FR) ........................... 1762632

(51) Int. Cl.
*H03H 17/02* (2006.01)
*G06F 17/17* (2006.01)
(Continued)

(52) U.S. Cl.
CPC ......... *H03H 17/0294* (2013.01); *G06F 17/17* (2013.01); *H03H 17/0211* (2013.01);
(Continued)

(58) Field of Classification Search
CPC ................... G06F 17/10; G06F 17/17; H04L 7/002–0029; H04L 2025/03509;
(Continued)

(56) References Cited

PUBLICATIONS

P. Gaydecki, Foundations of digital signal processing: Theory, algorithms and hardware design, Institution of Engineering and Technology, ch 1, ch 9, 2004 (Year: 2004).*

(Continued)

*Primary Examiner* — Emily E Larocque
(74) *Attorney, Agent, or Firm* — David D. Brush; Westman, Champlin & Koehler, P.A.

(57) ABSTRACT

A digital interpolation filter delivering a series of output samples approximating a signal x(t) at sampling instants of the form (n+d)T s based on a series of input samples of the signal x(t) taken at sampling instants of the form nT s. Such a filter implements a transfer function in the Z-transform domain, H c<i/>d (Z−1), expressed as a linear combination between: a first transfer function H 1 d<i/>(Z−1) representing a Lagrange polynomial interpolation of the input samples implemented according to a Newton structure (100); and a second transfer function H 2 d (Z−1) representing another polynomial interpolation of the input samples implemented according to another structure comprising at least the Newton structure; the linear combination being a function of at least one real combination parameter c.

17 Claims, 8 Drawing Sheets

(51) Int. Cl.
*H03H 17/06* (2006.01)
*H04L 25/03* (2006.01)

(52) U.S. Cl.
CPC ... *H03H 17/0621* (2013.01); *H04L 25/03006* (2013.01); *H03H 2017/0214* (2013.01); *H04L 2025/03509* (2013.01)

(58) Field of Classification Search
CPC .......... H04L 25/03006; H03H 17/0211; H03H 17/0294; H03H 17/0621; H03H 17/0657; H03H 2017/2014
See application file for complete search history.

(56) References Cited

PUBLICATIONS

A. Zeineddine et al, Generalization and Coefficients Optimization of the Newton Structure, IEEE, Sep. 17, 2018 (Year: 2018).*
S. Paquelet, Convergence of the Newton Structure Transfer Function to the Ideal Fractional Delay Filter, IEEE, Jul. 23, 2019 (Year: 2019).*
English translation of the Written Opinion of the International Searching Authority dated Jun. 23, 2020 for corresponding International Application No. PCT/EP2018/084244, filed Dec. 10, 2018.
French Search Report and Written Opinion dated Sep. 13, 2018 for corresponding French Application No. 1762632, filed Dec. 20, 2017.
International Search Report dated Mar. 26, 2019 for corresponding International Application No. PCT/EP2018/084244, filed Dec. 10, 2018.
Written Opinion of the International Searching Authority dated Mar. 26, 2019 for corresponding International Application No. PCT/EP2018/084244, filed Dec. 10, 2018.
L.F.O. Chamon et al. "Efficient filtering structure for spline interpolation and decimation" Electronics Letters, GB, vol. 52, No. 1, Jan. 8, 2016 (Jan. 8, 2016), pp. 39-41, DOI: 10.1049/el.2015.1957, ISSN: 0013-5194, XP055505846.

M.A. Al-Alaoui "Using fractional delay to control the magnitudes and phases of integrators and differentiators" Jun. 25, 2007 (Jun. 25, 2007), pp. 107-119, Retrieved from the Internet: https://feaweb.aub.edu.lb/research/dsaf/Publications/Alaoui_Fractional.pdf [Retrieved on Sep. 13, 2018] XP055507055.
Vesa Lehtinen et al. "Structures for Interpolation, Decimation, and Nonuniform Sampling Based on Newton's Interpolation Formula" Jan. 30, 2010 (Jan. 30, 2010), Retrieved from the Internet: https://hal.archives-ouvertes.fr/hal-00451769/document [retrieved on Sep. 13, 2018] XP055507059.
Zeineddine A et al. "Reconfigurable Newton Structure for Sample Rate Conversion" 2018 IEEE Global Conference on Signal and Information Processing (Globalsip), IEEE, Nov. 26, 2018 (Nov. 26, 2018), pp. 271-275, DOI: 10.1109/GLOBALSIP.2018.8646354, XP033520618.
Zeineddine A et al. "Variable Fractional Delay Filter: A Novel Architecture Based on Hermite Interpolation" 2018 25th International Conference on Telecommunications (ICT), IEEE, Jun. 26, 2018 (Jun. 26, 2018), pp. 93-97, DOI: 10.1109/ICT.20188464948, XP033400108.
Farrow, C. W. "A continuously variable digital delay element", IEEE International Symposium Article, dated 1988, pp. 2641-2645, vol. 3.
Valimaki, V. "A new filter implementation strategy for Lagrange interpolation", Circuits and Systems, 1995, ISCAS '95, 1995 IEEE International Symposium on, Seattle, WA, 1995, pp. 361-364 vol. 1.
Tassart, S., et al. "Fractional delay lines using Lagrange interpolation", Proceedings of the 1996 International Computer Music Conference, Hong Kong, Apr. 1996, p. 341-343.
Milovanovic, Gradimir V. et al., "Calculation of coefficients of a cardinal B-spline", Applied Mathematics Letters 23 dated Apr. 5, 2010, pp. 1346-1350.
Hunter, M. T. "Design of Polynomial-based Filters for Continuously Variable Sample Rate Conversion with Applications in Synthetic Instrumentation and Software Defined Radio", Thesis, University of Central Florida Orlando, Florida, 2008, 185 pages.
Soontornwong, Parinya et al. "A Cubic Hermite Variable Fractional Delay Filter", 2011 International Symposium on Intelligent Signal Processing and Communication Systems (ISPACS) Dec. 7-9, 2011, 4 pages.

* cited by examiner

DIGITAL INTERPOLATION FILTER, CORRESPONDING RHYTHM CHANGING DEVICE AND RECEIVING EQUIPMENT

CROSS-REFERENCE TO RELATED APPLICATIONS

This Application is a Section 371 National Stage Application of International Application No. PCT/EP2018/084244, filed Dec. 10, 2018, which is incorporated by reference in its entirety and published as WO 2019/121122 A1 on Jun. 27, 2019, not in English.

1 Technical Field

The field of the invention is that of digital sample interpolation.

More precisely, the invention concerns a digital interpolation filter with a configurable frequency response.

Such a filter is particularly useful for changing the sampling rate of signals with a variable frequency environment. Thus, the invention has many applications, particularly, but not exclusively, in the field of radio-frequency signal reception or audio-frequency signal processing.

2 Technological Background interpolation filters are digital filters that are used to calculate the value of a signal at instants when digital samples of the signal in question are not available.

For example, an interpolation filter has, as input, N available samples of the signal to be interpolated, as well as a parameter representative of the sampling instants at which samples of the signal are to be calculated. The filter then provides an approximation of the signal value at the desired instants as defined by the parameter in question.

Classically, the filters used to perform such a function are based on a polynomial interpolation of the input samples.

A commonly used structure to implement such a polynomial interpolation is the Farrow structure described in the article by Farrow, C. W. "*A continuously variable digital delay element Circuits and Systems*", IEEE International Symposium on, 1988, 2641-2645 vol. 3. Indeed, the Farrow structure enables a polynomial interpolation to be implemented regardless of the nature of the polynomials considered, which partly explains its success.

In this case, the parameter representative of the sampling instants of the filter output signal usually defines a delay (e.g. a fraction of the sampling period) with respect to the sampling instants of the samples available at the filter input. If necessary, such a delay can be made variable and reprogrammable on-the-fly between two samples also to allow a change in sampling frequency. In practice, the delay in question can a priori be arbitrary, only the hardware implementation constraints limiting the granularity of this parameter.

However, such a Farrow structure has a significant computational complexity. This is why structures derived from the Farrow structure have been proposed to reduce computational complexity.

An example can be cited of the symmetric Farrow structure described in Valimaki, V. "*A new filter implementation strategy for Lagrange interpolation*", Circuits and Systems, 1995. ISCAS '95, 1995 IEEE International Symposium on, Seattle, Wash., 1995, pp. 361-364 vol. 1. Such a structure keeps the advantage of being applicable to any type of polynomial, but provides little implementation gain. In particular, the complexity remains proportional to the square of the order of the implemented interpolation.

Alternatively, a structure called Newton's structure, described in the article by Tassart, S., Depalle, P. "*Fractional delay lines using Lagrange interpolation*", Proceedings of the 1996 International Computer Music Conference, Hong Kong, April 1996, p 341-343, derived from Farrow's structure, makes it possible to obtain a reduced computational complexity, proportional to the order of the implemented interpolation. However, such a structure only allows interpolations based on Lagrange polynomials.

However, such a structure has been generalized into a Newton-like structure described in the article by Lamb, D., Chamon, L., Nascimento, V. "*Efficient filtering structure for spline interpolation and decimation*", Electronics Letters, IET, 2015, 52, p 39-41. Such a quasi-Newton structure enables a computational complexity proportional to the order of the implemented interpolation to be kept, but for an interpolation based on Spline polynomials.

However, regardless of the filter structure considered, once the order and, where appropriate, the nature of the polynomials used for interpolation have been chosen, the filtering template is fixed.

However, some applications requiring such a change of rhythm would benefit from having an adaptive frequency response of the interpolation filter in question. For example, when implementing a multi-mode receiver, the environment of the signal to be received (in terms of interfering signals, etc.) depends on the standard in question.

The current solution is to completely reconfigure the interpolation filter response, particularly in terms of the nature of the interpolation polynomials, to adapt it to the new standard of the received signal when switching from one standard to another. In this case, this requires the use of a filter structure enabling any type of polynomial interpolation to be implemented. As discussed above, only the Farrow structure, whether symmetric or not, offers such flexibility. However, such a structure is complex in terms of computational load. Furthermore, such an approach requires calculating and/or storing a complete set of filter parameters for each reception configuration to be addressed. In practice, this limits such an approach to a few reception configurations.

There is therefore a need for an interpolation filter with a frequency and time response that can be configured for a reduced number of parameters.

There is also a need for such a filter to be simple in terms of hardware implementation.

3 SUMMARY

In one embodiment of the invention, a digital fractional delay device is provided comprising a digital interpolation filter delivering a series of output samples approximating a signal $x(t)$ at sampling instants of the form $(n+d)T_s$ based on a series of input samples of the signal $x(t)$ taken at sampling instants of the form $nT_s$, with n being an integer, $T_s$ a sampling period and d a real number. Such a filter implements a transfer function in the Z-transform domain, $H_c^d(Z^{-1})$, expressed as a linear combination between:
  a first transfer function $H_1^d(Z^{-1})$ representing a Lagrange-polynomial interpolation of the input samples implemented according to a Newton structure (as defined in part 5 of this patent application); and
  a second transfer function $H_2^d(Z^{-1})$ representing another polynomial interpolation of the input samples implemented according to another structure comprising at least the Newton structure. The linear combination is a function of at least one real combination parameter c.

Hence, the invention proposes a new and inventive solution to allow a simple hardware implementation of an interpolation filter with a configurable frequency and time response.

To do this, the hardware structure implementing the second transfer function comprises at least the Newton structure implementing the first transfer function. The overall hardware implementation of the interpolation filter thus takes advantage of the synergy between the two structures and the efficiency of the implementation of the Newton structure.

Moreover, the linear combination allows the global response of the interpolation filter to be configured in a simple manner between the responses of the two polynomial interpolations in question.

According to one embodiment, the linear combination of the first $H_1^d(Z^{-1})$ and second $H_2^d(Z^{-1})$ transfer functions is expressed as:

$$H_c^d(Z^{-1}) = H_1^d(Z^{-1}) + c(H_2^d(Z^{-1}) - H_1^d(Z^{-1}))$$

According to one embodiment, the other structure is a quasi-Newton structure (as defined in Part 5 of this patent application).

Thus, the hardware implementation of the second transfer function is also particularly efficient, and thus that of the global interpolation filter as well.

According to one embodiment, the other polynomial interpolation of the input samples belongs to the group comprising:
- a Spline polynomial interpolation of the input samples; and
- a Hermite polynomial interpolation of the input samples.

Thus, the quasi-Newton structure implementing the second transfer function is obtained directly and simply by using known synthesis methods.

According to one embodiment:
the first transfer function $H_1^d(Z^{-1})$ is expressed in a base of polynomials in $Z^{-1}$ corresponding to an implementation according to the Newton structure; and
the second transfer function $H_2^d(Z^{-1})$ is expressed at least partly in the polynomial base in $Z^{-1}$.

Thus, the first transfer function (representing a Lagrange interpolation) and the second transfer function are expressed at least partly on the same transform base corresponding to a hardware implementation in a particularly efficient form (i.e. according to a Newton structure).

In this way, reusing the Newton structure implementing the first transfer function to implement the second transfer function is simple and efficient.

According to one embodiment, the real number d is included in the segment $[-N/2; 1-N/2[$, the order of the Lagrange interpolation being equal to $N-1$, with N an integer. The second transfer function $H_2^d(Z^{-1})$ is expressed as:

$$H_2^d(Z^{-1}) = \sum_{n=1}^{N} q_{n,1}(1-Z^{-1})^{n-1} + \sum_{n=1}^{N}\sum_{m=2}^{N} q_{n,m}\left[(1-Z^{-1})^{n-1}\prod_{i=0}^{m-2}(d+i)\right]$$

with $q_{n,m}$ elements of a matrix Q of N rows and N columns, the matrix Q expressed as a product of matrices:

$$Q = (T_d^T)^{-1} P T_z^{-1}$$

where:
$T_d$ a matrix of N rows and N columns transforming a vector $\vec{\mu} = [1, \mu, \mu^2, \ldots, \mu^{N-1}]$ into a vector $\vec{d} = [1, d, d(d+1), \ldots, \prod_{i=0}^{N-2}(d+i)]$, where $\mu = d + (N-1)/2$;
$T_z$ a matrix of N rows and N columns transforming a vector $\vec{Z} = [1, z^{-1}, z^{-2}, \ldots, z^{-(N-1)}]$ into a vector $\vec{\nabla Z} = [1, (1-z^{-1}), (1-z^{-1})^2, \ldots, (1-z^{-1})^{N-1}]$;
P a symmetric Farrow matrix representing the other interpolation, the matrix P having N rows and N columns and representing a transfer function in the Z-transform domain, $H_2^\mu(Z^{-1})$ being expressed as:

$$H_2^\mu(Z^{-1}) = \sum_{j=1}^{N} \beta_j(\mu) z^{-(j-1)} = \sum_{j=1}^{N}\left(\sum_{i=1}^{N} p_{i,j}\mu^{i-1}\right) z^{-(j-1)}$$

with $p_{i,j}$ a row index element i and a column index element j of the matrix P, the N polynomials $\beta_j(\mu)$ verifying $\beta_j(\mu) = +\beta_{N-j+1}(\mu)$ or $\beta_j(\mu) = \beta_{N-j+1}(\mu)$.

Thus, an expression of the second transfer function on the transform base (i.e. based on polynomials of the form $(1-Z^{-1})^k$, with k an integer) is easily obtained, regardless of the nature of the polynomial interpolation associated with the second transfer function. Indeed, a symmetric Farrow matrix can be obtained for a polynomial interpolation whatever the nature of the polynomials in question.

According to one embodiment, the transfer function $H_2^\mu(Z^{-1})$ represents a symmetric Farrow structure implementing a Spline or Hermit polynomial interpolation of the input samples.

According to one embodiment, the matrix $T_d$ is expressed as a product of matrices $T_d = T_2^d T_d^1$, with $T_d^1$ and $T_d^2$ two matrices of N rows and N columns, at least one element, $T_d^1[i,j]$, of row index i and column index j, of the matrix $T_d^1$, being proportional to $$\binom{i-1}{j-1}\left(-\frac{N-1}{2}\right)^{i-j}, \text{ with } \binom{i-1}{j-1}$$

a binomial coefficient read $j-1$ among $i-1$. At least one element, $T_d^2[i, j]$, of row index i and column index j of the matrix $T_d^2$, being proportional to a Stirling number of the first kind $S_{j-1}^{(i-1)}$.

According to one embodiment, at least one element, $T_z[i,j]$, of row index i and column index j, of the matrix $T_z$, is proportional to $$\binom{i-1}{j-1}(-1)^{j+1}, \text{ with } \binom{i-1}{j-1}$$

a binomial coefficient read $j-1$ among $i-1$.

Thus, the expression of the second transfer function on the transform base in question is obtained regardless of the order of the interpolation considered.

Depending on the embodiment, the real number d and/or the combination parameter c is/are variable.

Thus, the frequency and time response of the interpolation filter is reconfigurable.

According to one embodiment, the filter comprising a modified Newton structure comprising:
- the Newton structure; and
- at least one additional feedback loop between:
    - an output of a delay line of the Newton structure; and
    - an output of the Newton structure;

the at least one additional feedback loop comprising at least one multiplier block. An operand of the at least one multiplier block is proportional to the combination parameter c.

Thus, the adaptability of the response of the interpolation filter is achieved with a minimal modification of the Newton structure, and thus at a reduced material cost.

According to one embodiment, the modified Newton structure implements:
- the Newton structure when the combination parameter c is 0; and
- the quasi-Newton structure when the combination parameter c is 1.

According to one embodiment, the combination parameter c is fixed and the filter comprises a modified Newton structure comprising, at least in part, the Newton structure.

In one embodiment of the invention, there is a sampling rhythm changing device comprising at least one digital device according to the invention (according to any one of its embodiments).

Thus, the characteristics and advantages of this device are the same as the digital interpolation filter described above. Consequently, they are not detailed further.

In one embodiment of the invention, there is an item of equipment for receiving a radio-frequency signal comprising at least one device for changing the sampling rhythm comprising at least one digital interpolation filter according to the invention (according to any one of its embodiments).

4 LIST OF FIGURES

Other characteristics and advantages of the invention will emerge upon reading the following description, provided as a non-restrictive example and referring to the annexed drawings, wherein:

FIGS. 7a, 7b and 7c illustrate a multi-mode radio frequency receiving equipment comprising two sampling rhythm changing devices each implementing the digital device in FIG. 3a;

5 DETAILED DESCRIPTION OF THE INVENTION

Figure 1:
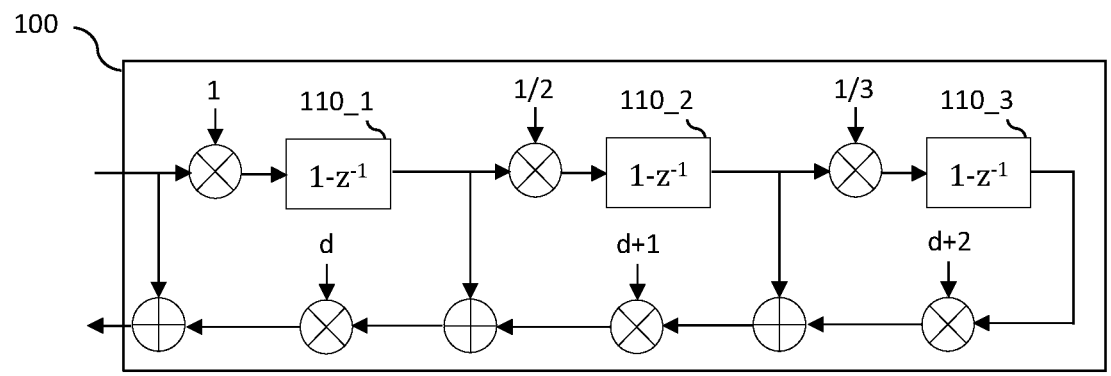
FIG. 1 illustrates a known interpolation filter implementing a third-order Lagrange interpolation implemented according to a Newton structure.

In all the figures in this document, identical elements and steps are designated by the same reference.

The general principle of the described technique consists in implementing a digital fractional delay device comprising a digital interpolation filter delivering a series of output samples approximating a signal x(t) at sampling instants of the form $(n+d)T_s$ based on a series of input samples of the signal x(t) taken at sampling instants of the form $nT_s$ with n an integer, $T_s$ a sampling period and d a real number representing the delay applied to the sampling instants.

In particular, the interpolation filter implements a transfer function in the Z-transform domain, $H_c^d(Z^{-1})$, expressed as a linear combination between:
- a first transfer function $H_1^d(Z^{-1})$ representing a Lagrange-polynomial interpolation of the input samples implemented according to a Newton structure; and
- a second transfer function $H_2^d(Z^{-1})$ representing another polynomial interpolation of the input samples implemented according to another structure comprising at least the Newton structure in question.

The terminology "implement a transfer function according to a given structure" is used in this patent application to mean that the hardware implementation of the filter in question corresponds (in terms of the functionalities used) to the mathematical expressions explained in the transfer function considered. There is thus a direct relationship between the expression of the transfer function under consideration and the corresponding hardware implementation.

Moreover, the linear combination is a function of at least one real combination parameter c.

The overall hardware implementation of the digital device comprising the interpolation filter thus takes advantage of the synergy between the Newton structure implementing the first transfer function $H_1^d(Z^{-1})$ and the structure implementing the second transfer function $H_2^d(Z^{-1})$.

Moreover, the linear combination allows the global response of the interpolation filter to be configured in a simple manner between the responses of the two polynomial interpolations in question.

In one embodiment, the second transfer function $H_2^d(Z^{-1})$ is expressed at least in part on a polynomial base in $Z^{-1}$ corresponding to an implementation of the first transfer function $H_1^d(Z^{-1})$ according to the Newton structure. This is to facilitate the reuse of the Newton structure in question. Such a base, called transform base in the following description, comprises polynomials of the form $(1-Z^{-1})^k$ with k an integer, as described below.

For this purpose, the method disclosed in the above-mentioned article by Lamb et al. is generalised to an interpolation of any order. Such a generalised method indeed enables an expression of the second transfer function $H_2^d(Z^{-1})$ to be determined in the transform base from an expression of the same transfer function, but expressed in a base adapted to a symmetric Farrow implementation.

Such a method is thus of interest insofar as a Farrow structure, even symmetric, enables a polynomial interpolation to be implemented whatever the nature of the polynomials involved. An expression of the transfer function of any type of polynomial interpolation can thus be obtained in the transform base by such a method.

To do this, an expression of the impulse response h(t) of a filter implementing the polynomial interpolation under consideration must first be obtained in order to determine the corresponding Farrow matrix.

In particular, such an impulse response h(t) is expressed as a concatenation of N polynomial sections $\beta_j(\mu) = \sum_{i=1}^{N} p_{i,j} \mu^{i-1}$, with $\mu \in [-1/2; 1/2[$ and i and j two integers each from 1 to N, the polynomials $\beta_j(u)$ being translated over successive time segments such that:

$$h(t) = \sum_{j=1}^{N} \beta_j\left(\frac{t}{T_s} - j + \frac{1}{2}\right) \quad \text{(Eq-1)}$$

Further, according to the definition considered in this patent application, the impulse response h(t) is centred on the time axis so as to be symmetrical in $t/T_s = (N+1)/2$. In other words, the N polynomials $\beta_j(\mu)$ verify $\beta_j(\mu) = +\beta_{N-j+1}(\mu)$ or $\beta_j(\mu) = -\beta_{N-j+1}(\mu)$ depending on whether the symmetry is even or odd.

Hence, the matrix P comprised of the elements $p_{i,j}$ is a symmetric Farrow matrix as introduced in the above-mentioned article by Valimaki.

Referring to the above-mentioned article by Lamb et al, the change of base from the Farrow base to the transform base is obtained by the matrix operation:

$$Q = (T_d^T)^{-1} P T_z^{-1} \quad \text{(Eq-2)}$$

where:

$T_d$ a matrix of N rows and N columns transforming a vector $\vec{\mu} = [1, \mu, \mu^2, \ldots, \mu^{N-1}]$ into a vector $\vec{d} = [1, d, d(d+1), \ldots, \Pi_{i=0}^{N-2}(d+i)]$, with $d = \mu - (N-1)/2$; and $T_Z$ a matrix of N rows and N columns transforming a vector $\vec{Z} = [1, z^{-1}, z^{-2}, \ldots, z^{-(N-1)}]$ into a vector $\vec{\nabla Z} = [1, (1-z^{-1}), (1-z^{-1})^2, \ldots, (1-z^{-1})^{N-1}]$.

In particular, the matrix $T_d$ is expressed as a product of matrices $T_d = T_d^2 T_d^1$ With $T_d^1$ and $T_d^2$ two matrices of N rows and N columns. The element $T_d^1[i,j]$, of row index i and column index j, of the matrix $T_d^1$ is equal to $$\binom{i-1}{j-1}\left(-\frac{N-1}{2}\right)^{i-j}, \text{ with } \binom{i-1}{j-1}$$

the binomial coefficient read j−1 among i−1. Similarly, the element $T_d^2[i,j]$, of row index i and column index j, of the matrix $T_d^2$, is equal to the Stirling number of the first kind $S_{j-1}^{(i-1)}$.

Further, the element $T_z[i,j]$, of row index i and column index j, of the matrix $T_z$ is equal to $$\binom{i-1}{j-1}(-1)^{j+1} \text{ with } \binom{i-1}{j-1}$$

the binomial coefficient read j−1 among i−1.

The change of base in question thus makes it possible to obtain the transfer function $H^d(Z^{-1})$ of the filter implementing the polynomial interpolation considered in the transform base in the form:

$$H^d(Z^{-1}) = \sum_{n=1}^{N} q_{n,1}(1-Z^{-1})^{n-1} + \sum_{n=1}^{N}\sum_{m=2}^{N} q_{n,m}\left[(1-Z^{-1})^{n-1}\prod_{i=0}^{m-2}(d+i)\right]$$

with $q_{n,m}$ the elements of the matrix Q of N rows and N columns.

In particular, the transfer function $H^d(Z^{-1})$ of an interpolation filter implementing a Lagrange interpolation expressed in the transform base corresponds to an implementation according to a Newton structure as discussed in the above-mentioned article by Lamb et al. and as illustrated below in relation to FIG. 1.

Indeed, a known interpolation filter implementing a third-order Lagrange interpolation implemented according to a Newton structure 100 is now described in relation to FIG. 1.

In order to obtain an expression of the transfer function $H_L^d(Z^{-1})$ of the interpolation filter in question in the transform base, the base change method described above is applied for example.

In particular, an expression of the impulse response h(t) of the filter in question is first obtained in order to determine the corresponding symmetric Farrow matrix $P_L$.

To do so, it is noted that such an interpolation seeks to construct the polynomial y(t) that goes through the N samples x[j], j from 1 to N, of the input signal x(t) such that:

$$y(t) = \sum_{j=1}^{N} L_{(N-j+1)}\left(\frac{t}{T_s}\right)x[j]$$

where $t/T_s \in [N/2-1; N/2[$.

The Lagrange polynomials are known and defined as follows:

$$L_j\left(\frac{t}{T_s}\right) = \prod_{\substack{k=0 \\ k \neq j-1}}^{N-1} \frac{\frac{t}{T_s} - k}{k - j + 1}$$

In order to obtain an impulse response centred on the time axis so as to present symmetry, here even, in $t/T_s = (N+1)/2$, the polynomials $$L_j\left(\frac{t}{T_s}\right)$$

as defined above are translated along the time axis by a value of $T_s(N-1)/2$. In this way, the polynomials $\beta_j(\mu)$ required to define the matrix $P_L$ are obtained according to:

$$\beta_j(\mu) = L_j\left(\mu + \frac{N-1}{2}\right) = \prod_{\substack{k=0 \\ k \neq j-1}}^{N-1} \frac{\mu + \frac{N-1}{2} + k}{k - j + 1}$$

where $\mu \in [-\frac{1}{2}; \frac{1}{2}[$.

In this manner, for N=4, one obtains:

$$\beta_1(t) = \frac{1}{48}(8\mu^3 + 12\mu^2 - 2\mu - 3)$$

$$\beta_2(t) = \frac{1}{48}(-24\mu^3 - 12\mu^2 + 54\mu + 27)$$

$$\beta_3(t) = \frac{1}{48}(24\mu^3 - 12\mu^2 - 54\mu + 27)$$

$$\beta_4(t) = \frac{1}{48}(-8\mu^3 + 12\mu^2 + 2\mu - 3)$$

Thus, the symmetric Farrow matrix $P_L$ corresponding to the third-order Lagrange interpolation is expressed according to our definitions as:

$$P_L = \frac{1}{48}\begin{pmatrix} -3 & 27 & 27 & -3 \\ -2 & 54 & -54 & 2 \\ 12 & -12 & -12 & 12 \\ 8 & -24 & 24 & -8 \end{pmatrix}$$

It is noted that this expression differs from equation (3) in the above-mentioned publication by Lamb et al. due to a different choice in the definition of the parameter µ (chosen here as the opposite of the publication in question).

Furthermore, on the basis of the general expressions of the elements of the matrices $T_d$ and $T_z$ data above, the matrices $(T_d^T)^{-1}$ and $T_z^{-1}$ are expressed in the case N=4 as:

$$(T_d^T)^{-1} = \begin{pmatrix} 1 & 3/2 & 9/4 & 27/8 \\ 0 & 1 & 2 & 13/4 \\ 0 & 0 & 1 & 3/2 \\ 0 & 0 & 0 & 1 \end{pmatrix} \text{ and:} \quad \text{(Eq-4)}$$

$$T_Z^{-1} = \begin{pmatrix} 1 & 0 & 0 & 0 \\ 1 & -1 & 0 & 0 \\ 1 & -2 & 1 & 0 \\ 1 & -3 & 3 & -1 \end{pmatrix} \quad \text{(Eq-5)}$$

In this way, the matrix $Q_L$ obtained by the equation (Eq-2) is expressed in this case as:

$$QL = \begin{pmatrix} 1 & 0 & 0 & 0 \\ 0 & 1 & 0 & 0 \\ 0 & 0 & 1/2 & 0 \\ 0 & 0 & 0 & 1/6 \end{pmatrix}$$

As expected, the base change made leads to an expression of the diagonal matrix $Q_L$. The associated transfer function $H_L^d(Z^{-1})$ obtained from the matrix $Q_L$ via the equation (Eq-3), then corresponds to an implementation in the form of a structure 100 implementing only three delay lines 110_1, 110_2, 110_3 of the form $(1-Z^{-1})^k$, where k is an integer from 1 to 3.

The transform base used to express the transfer function $H_L^d(Z^{-1})$ of the Lagrange interpolation thus leads to a particularly efficient implementation in computational terms, known as the Newton structure 100.

Figure 2:
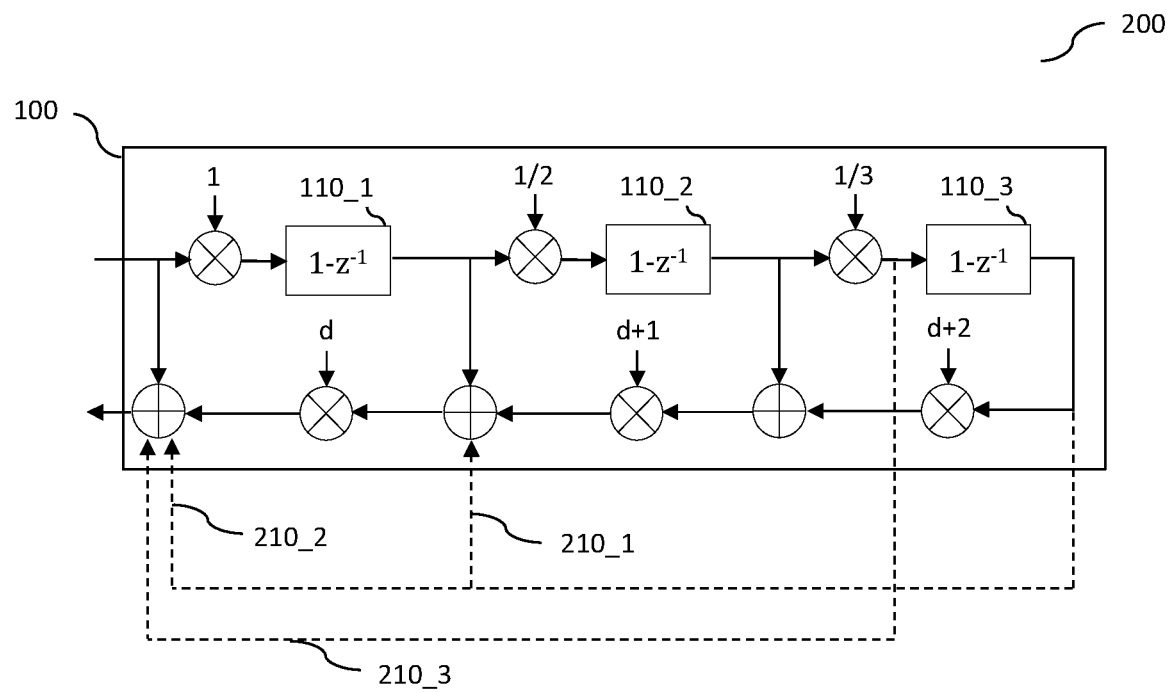
FIG. 2 illustrates a known interpolation filter implementing a third-order Spline interpolation with a quasi-Newton structure.

A known interpolation filter implementing a third-order Spline interpolation with a quasi-Newton structure 200 is now described in relation to FIG. 2.

In particular, such a structure 200 corresponds to an expression of the transfer function $H_S^d(Z^{-1})$ of the interpolation filter in question in the transform base.

As such, the base-change method described above is applied, for example, to obtain the expression of the transfer function in question.

Again, an expression of the impulse response h(t) of the filter in question is first obtained in order to determine the corresponding symmetric Farrow matrix $P_S$.

To do so, it is noted that such an interpolation seeks to construct the polynomial y(t) that goes through the N samples x[j], j from 1 to N, of the input signal x(t) such that:

$$y(t) = \sum_{j=1}^{N} S_{(N-j+1)}\left(\frac{t}{T_s} + \frac{N}{2} - j + 1\right) \times [j]$$

where $t/T_s \in [N/2-1; N/2[$.

The Spline polynomials $$S_{(j)}\left(\frac{t}{T_s}\right)$$

considered here are determine for example by the method described in the article by Gradimir V. Milovanović and Zlatko Udovičić, "*Calculation of coefficients of a cardinal B-spline*", in Applied Mathematics Letters, Volume 23, Issue 11, 2010, Pages 1346-1350.

In particular, the temporal support of the polynomial $$S_{(j)}\left(\frac{t}{T_s}\right)$$

obtained by this method extends over the interval [j−1;j]. In this way, the polynomials $\beta_j(\mu)$, with $\mu \in [-1/2; 1/2[$, defining the impulse response sought via the equation (Eq-1) are obtained via temporal translation:

$$\beta_j(\mu) = S_j\left(\mu + j - \frac{1}{2}\right)$$

The result in the example that interests us, i.e. for N=4, is that:

$$\beta_1(t) = \frac{1}{48}(8\mu^3 + 12\mu^2 + 6\mu + 1)$$

$$\beta_2(t) = \frac{1}{48}(-24\mu^3 - 12\mu^2 + 30\mu + 23)$$

$$\beta_3(t) = \frac{1}{48}(24\mu^3 - 12\mu^2 - 30\mu + 23)$$

$$\beta_4(t) = \frac{1}{48}(-8\mu^3 + 12\mu^2 - 6\mu + 1)$$

Thus, the symmetric Farrow matrix $P_S$ corresponding to the third-order Spline interpolation is expressed according to our definitions as:

$$P_s = \frac{1}{48}\begin{pmatrix} 1 & 23 & 23 & 1 \\ 6 & 30 & -30 & -6 \\ 12 & -12 & -12 & 12 \\ 8 & -24 & 24 & -8 \end{pmatrix}$$

It is noted here again that this expression differs from equation (8) in the above-mentioned publication by Lamb et al. due to a different choice in the definition of the parameter µ (chosen here as the opposite of the publication in question).

Further, on the basis of the expressions of the matrices $(T_d^T)^{-1}$ and $T_z^{-1}$ given respectively by equations (Eq-4) and (Eq-5), the matrix $Q_S$ obtained by equation (Eq-2) is expressed in this case as:

$$Q_S = \begin{pmatrix} 1 & 0 & 1/6 & 1/6 \\ 0 & 1 & 0 & 1/6 \\ 0 & 0 & 1/2 & 0 \\ 0 & 0 & 0 & 1/6 \end{pmatrix}$$

It is observed that:
the diagonal of the matrix $Q_S$ is identical to that of the matrix $Q_L$ obtained above for a third-order Lagrange interpolation; and
only three extra-diagonal elements of the matrix $Q_S$ are non null. In other words, the matrix $Q_S$ is hollow.

These two characteristics of the matrix $Q_S$ are found in the implementation of the associated transfer function, $H_S^d(Z^{-1})$, where this implementation is based on the use of delay lines of the form $(1-Z^{-1})^k$ corresponding to an expression of $H_S^d(Z^{-1})$ in the transform base ($H_S^d(Z^{-1})$ being obtained from the matrix $Q_S$ via equation (Eq-3)).

More specifically, the implementation in question includes:
the Newton structure 100, implementing the Lagrange interpolation filter described in relation to FIG. 1; and
three additional return loops 210_1, 210_2, 210_3 (dotted arrows in FIG. 2) between an output of a delay line (of the form $(1-Z^{-1})^k$) of the Newton structure 100 and the output of the Newton structure 100. In practice, such loops are made either directly to the output of the Newton structure 100 (case of loops 210_2 and 210_3), or indirectly, i.e. via other elements of the initial feedback loop of the Newton structure 100 (case of loop 210_1).

Due to the small number of additional return loops 210_1, 210_2, 210_3 (i.e. the matrix $Q_S$ is hollow), such an implementation corresponds to a quasi-Newton structure 200.

Figure 3A:
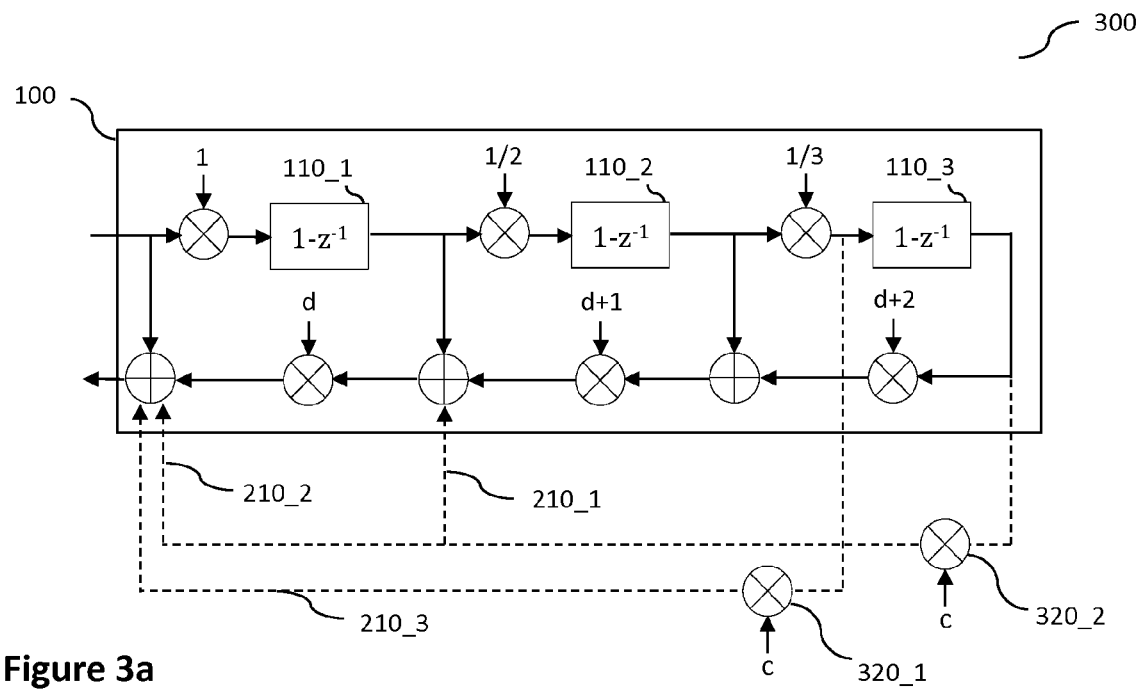
FIGS. 3a and 3b illustrate a digital fractional delay device comprising an interpolation filter resulting from a linear combination of the filters of FIGS. 1 and 2 according to one embodiment of the invention.
Figure 3B:
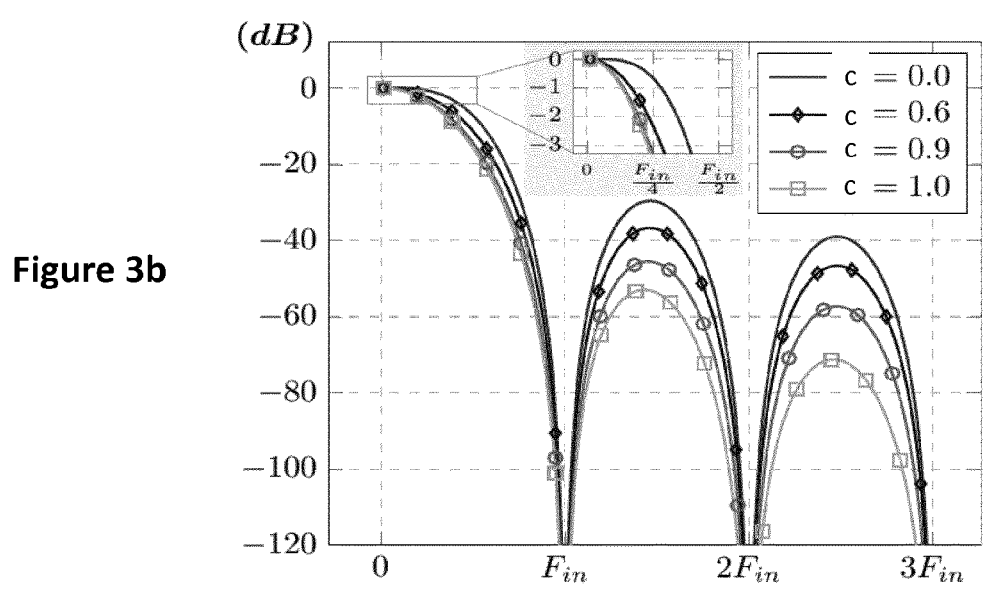

A digital fractional delay device comprising an interpolation filter resulting from a linear combination of the filters of FIGS. 1 and 2 according to one embodiment of the invention is now described in relation to FIGS. 3a and 3b.

In particular, the interpolation filter according to this embodiment implements a third-order polynomial interpolation including a transfer function in the Z-transform domain, $H_{LS}^d(Z^{-1})$, expressed as a linear combination between:

the transfer function $H_L^d(Z^{-1})$ representing the Lagrange interpolation filter of FIG. 1 implemented according to the Newton structure 100; and
the transfer function $H_S^d(Z^{-1})$ representing the Spline interpolation filter in FIG. 2 implemented according to the quasi-Newton structure 200.

More specifically, in this embodiment, the transfer function $H_{LS}^d(Z^{-1})$ is expressed as:

$$H_{LS}^d(Z^{-1})=H_L^d(Z^{-1})+c(H_S^d(Z^{-1})-H_L^d(Z^{-1}))$$

Thus, the transfer function $H_{LS}^d(Z^{-1})$ appears as configurable according to the combination parameter c. In particular, the magnitude of the transfer function $H_{LS}^d(Z^{-1})$ of the filter according to the invention varies between the amplitude of the transfer function $H_L^d(Z^{-1})$ of the third-order Lagrange interpolation for c=0 and that of the transfer function $H_S^d(Z^{-1})$ of the Spline interpolation of the same order for c=1 as shown in FIG. 3b. Moreover, a value of c greater than 1 can also be used.

Equivalently, it is obtained by linearity of the equation (Eq-3) that the matrix $Q_{LS}$, representing the function $H_{LS}^d(Z^{-1})$ in the transform base, expresses itself as:

$$Q_{LS}=Q_L+c(Q_S-Q_L)$$

From matrix expressions $Q_L$ and $Q_S$ obtained above in relation to FIGS. 1 and 2 respectively, the matrix $Q_{LS}$ is expressed as:

$$Q_{LS} = \begin{pmatrix} 1 & 0 & c/6 & c/6 \\ 0 & 1 & 0 & c/6 \\ 0 & 0 & 1/2 & 0 \\ 0 & 0 & 0 & 1/6 \end{pmatrix}$$

The corresponding structure 300 (FIG. 3a) is similar to the quasi-Newton structure 200 in FIG. 2. Only the three additional return loops 210_1, 210_2, 210_3 differ in that they are weighted by the combination parameter c. In practice, such a weighting is carried out, for example, by a multiplier 320_1, 320_2 on the return loops in question, an operand of the multipliers 320_1 and 320_2 being proportional to the combination parameter c.

Specifically, structure 300 appears as a modified Newton structure that implements:
the Newton structure 100 when the combination parameter c is 0; and
the quasi-Newton structure 200 when the combination parameter c is 1.

Figure 4:
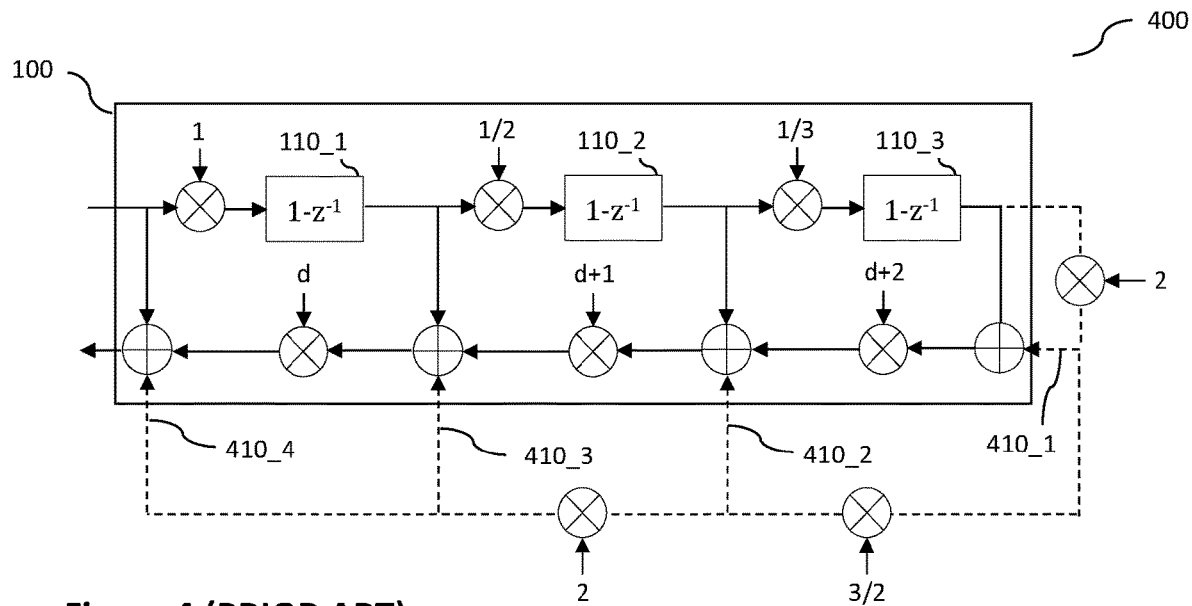
FIG. 4 illustrates a known interpolation filter implementing a third-order Hermite interpolation with a quasi-Newton structure.

A known interpolation filter implementing a third-order Hermite interpolation with a quasi-Newton structure 400 is now described in relation to FIG. 4.

In particular, such a structure 400 corresponds to an expression of the transfer function $H_H^d(Z^{-1})$ of the interpolation filter in question in the transform base.

As such, the base-change method described above is applied, for example, to obtain the expression of the transfer function in question.

Again, an expression of the impulse response h(t) of the filter in question is first obtained in order to determine the corresponding symmetric Farrow matrix $P_S$. However, in the case of Hermite interpolation, the derivative of the polynomials must also be estimated at the sampling points of the signal in addition to the polynomials themselves.

In particular, such an interpolation seeks to construct the polynomial y(t) that goes through the $N_P$ samples x[j], j from 1 to $N_P$, of the input signal x(t), while imposing the equality of the derivatives of y(t) and the interpolated signal x(t) at the same sampling points x[j]. In other words, $N_H=N_P(p+1)$ constraints of the form are obtained:

$$y^{(i)}(jT_s)=x^{(i)}[j]$$

where $i\in\{0, 1, 2, \ldots, p\}$, $j\in\{1, 2, \ldots, N_P\}$ and $.^{(i)}$ which indicates the i-order derivative.

The polynomial y(t) is thus generally expressed as:

$$y(t) = \sum_{i=1}^{N_H} a_i t^{i-1}$$

The $N_H$ constraints applied to the $N_H$ unknown $a_i$ lead to a linear system of $N_H$ equations whose resolution can express the coefficients $a_i$ depending on the values of the samples x[j]. Based on the expression in question of the coefficients $a_i$, it appears that the polynomial y(t) can be generally rewritten as:

$$y(t) = \sum_{i=0}^{p} \sum_{j=1}^{N_P} \alpha_{ij}(t) x^{(i)}[j]$$

In order to describe a third-order interpolation filter whose transfer function can be modelled by matrices $P_S$ and $Q_S$ that are square and of a size 4×4 (so that they can be combined with the matrices $P_L$ and $Q_L$ of the filter of FIG. 1 to obtain the filter according to the invention described below in relation to FIG. 5a), the following case $N_P=2$ and $p=1$ is considered.

In this way, the following values of the polynomials $\alpha_{i,j}(t)$ are obtained:

$$\alpha_{0,1}(t)=2t^3-3t^2+1$$

$$\alpha_{1,1}(t)=-2t^3-3t^2$$

$$\alpha_{0,2}(t)=t^3-2t^2+t$$

$$\alpha_{1,2}(t)=t^3-t^2$$

Further, the second-order derivative estimation method as used for example in the article by Soontornwong, P., Chivapreecha, S. & Pradabpet, C. "*A Cubic Hermite variable fractional delay filter Intelligent Signal Processing and Communications Systems*" (ISPACS), 2011 International Symposium on, 2011, pp 1-4, is implemented to estimate derivatives $x^{(i)}[j]$ of the signal x(t) at sampling points x[j]. Thus, $\gamma=2$ two samples are used to estimate the value of a derivative at a given point.

In this manner, the Hermit polynomials $$H_j\left(\frac{t}{T_s}\right)$$

are finally determined so that y(t) is expressed as:

$$y(t) = \sum_{j=1}^{N} H_{(N-j+1)}\left(\frac{t}{T_s}\right) \times [j]$$

where $t/T_s \in [N_P/2-1; N_P/2[$ and $N=N_P+\gamma=4$.

The polynomials $\beta_j(\mu)$, with $\mu \in [-1/2; 1/2[$, defining the impulse response sought via the equation (Eq-1) are obtained via time translation:

$$\beta_j(\mu) = H_j\left(\mu + \frac{N_P-1}{2}\right)$$

The result in the example that interests us, i.e. for $N=N_P+\gamma=4$, is that:

$$\beta_1(t) = \frac{1}{48}(8\mu^3 + 4\mu^2 - 2\mu - 1)$$

$$\beta_2(t) = \frac{1}{48}(-24\mu^3 - 4\mu^2 + 22\mu + 9)$$

$$\beta_3(t) = \frac{1}{48}(24\mu^3 - 4\mu^2 - 22\mu + 9)$$

$$\beta_4(t) = \frac{1}{48}(-8\mu^3 + 4\mu^2 + 2\mu - 1)$$

Thus, the symmetric Farrow matrix $P_H$ corresponding to the third-order Hermite interpolation considered is expressed according to our definitions as:

$$P_H = \frac{1}{16}\begin{pmatrix} -1 & 9 & 9 & -1 \\ -2 & 22 & -22 & 2 \\ 4 & -4 & -4 & 4 \\ 8 & -24 & 24 & -8 \end{pmatrix}$$

Further, on the basis of the expressions of the matrices $(T_d^T)^{-1}$ and $T_z^{-1}$ given respectively by equations (Eq-4) and (Eq-5), the matrix $Q_H$ obtained by equation (Eq-2) is expressed in this case as:

$$Q_H = \begin{pmatrix} 1 & 0 & 0 & 1 \\ 0 & 1 & 0 & 1 \\ 0 & 0 & 1/2 & 1/2 \\ 0 & 0 & 0 & 1/6+1/3 \end{pmatrix}$$

It is observed that:

the diagonal of the matrix $Q_H$ is expressed as that of the matrix $Q_L$ (obtained above for a third-order third-order Lagrange interpolation) to which the term ⅓ is added to the last value of the diagonal; and only three extra-diagonal elements of the matrix $Q_H$ are non null. In other words, the matrix $Q_H$ is also hollow, as is the matrix $Q_S$ obtained above in relation to FIG. 2.

These two characteristics of the matrix $Q_H$ are found in the implementation of the associated transfer function, $H_H^d(Z^{-1})$, where this implementation is based on the use of delay lines of the form $(1-Z^{-1})^k$, corresponding to an expression of $H_H^d(Z^{-1})$ in the transform base ($H_H^d(Z^{-1})$ being obtained from the matrix $Q_H$ via equation (Eq-3)).

More specifically, the implementation in question includes:

the Newton structure 100, implementing the Lagrange interpolation filter described in relation to FIG. 1; and four additional return loops 410_1 to 410_3 (dotted arrows in FIG. 4) between an output of a delay line (of the form $(1-Z^{-1})^k$) of the Newton structure 100 and the output of the Newton structure 100. Here again, such loops are made either directly to the output of the Newton structure 100 (case of loop 410_4), or indirectly, i.e. via other elements of the initial feedback loop of the Newton structure 100 (case of loops 410_1, 410_2 and 410_3).

Due to the small number of additional return loops 410_1, 410_2, 410_3 (i.e. the matrix $Q_H$ is hollow and consists of only three extra-diagonal elements, such as the matrix $Q_S$ discussed above in relation to FIG. 2), such an implementation also corresponds to a structure 400 called quasi-Newton.

Figure 5A:
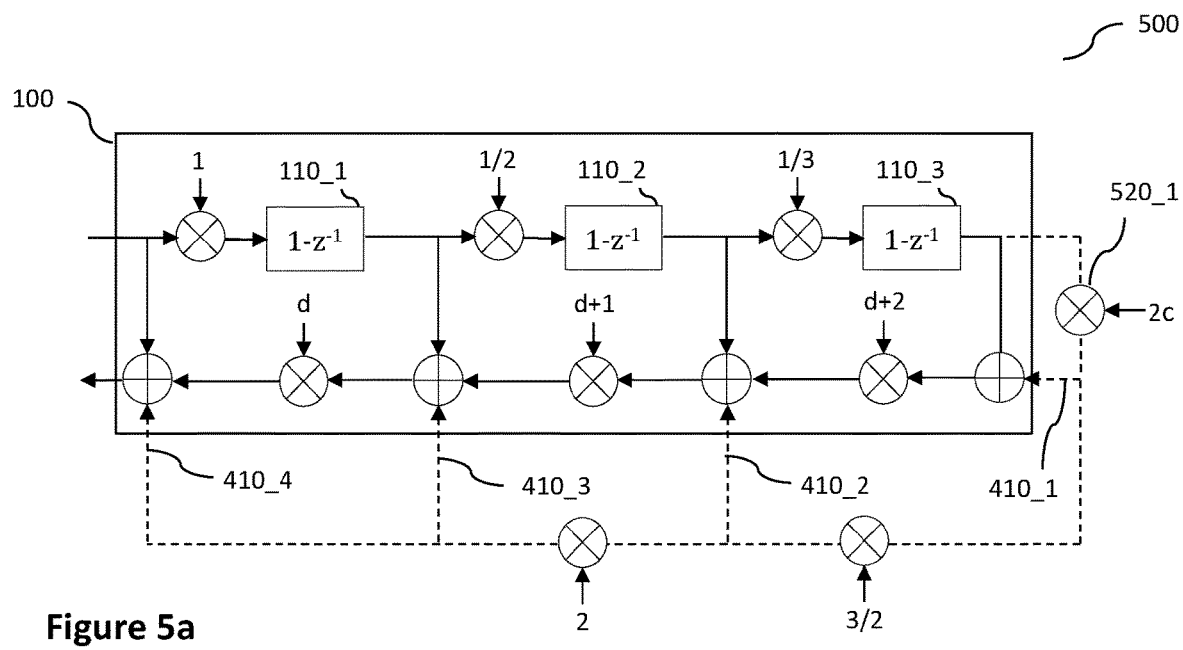
FIGS. 5a and 5b illustrate a digital fractional delay device comprising an interpolation filter resulting from a linear combination of the filters of FIGS. 1 and 4 according to one embodiment of the invention.
Figure 5B:
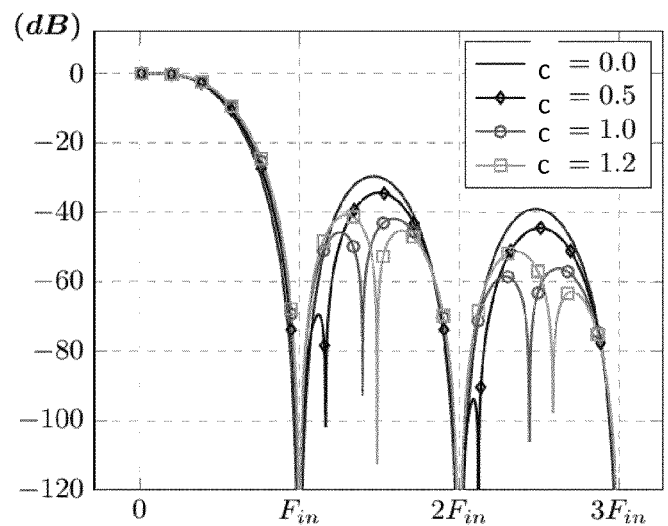

A digital fractional delay device comprising an interpolation filter resulting from a linear combination of the filters of FIGS. 1 and 4 according to one embodiment of the invention is now described in relation to FIGS. 5a and 5b.

In particular, the interpolation filter according to this embodiment implements a third-order polynomial interpolation including a transfer function in the Z-transform domain, $H_{LH}^d(Z^{-1})$, expressed as a linear combination between:
- the transfer function $H_L^d(Z^{-1})$ representing the Lagrange interpolation filter of FIG. 1 implemented according to the Newton structure 100; and
- the transfer function $H_H^d(Z^{-1})$ representing the Hermite interpolation filter in FIG. 4 implemented according to the quasi-Newton structure 400.

More specifically, in this embodiment, the transfer function $H_{LH}^d(Z^{-1})$ is expressed as:

$$H_{LH}^d(Z^{-1}) = H_L^d(Z^{-1}) + c(H_H^d(Z^{-1}) - H_L^d(Z^{-1}))$$

Thus, the transfer function $H_{LH}^d(Z^{-1})$ appears as configurable according to the combination parameter c. In particular, the amplitude of the transfer function $H_{LH}^d(Z^{-1})$ of the filter according to the invention varies between the amplitude of the transfer function $H_L^d(Z^{-1})$ of the third-order Lagrange interpolation for c=0 and that of the transfer function $H_H^d(Z^{-1})$ of the Hermite interpolation of the same order for c=1 as shown in FIG. 5b. Further, a combination parameter c with a value greater than 1 can also be used (here c=1,2 is also represented).

Equivalently, it is obtained by linearity of the equation (Eq-3) that the matrix $Q_{LH}$, representing the function $H_{LH}^d(Z^{-1})$ in the transform base, expresses itself as:

$$Q_{LH} = Q_L + c(Q_H - Q_L)$$

From matrix expressions $Q_L$ and $Q_H$ obtained above in relation to FIGS. 1 and 4 respectively, the matrix $Q_{LH}$ is expressed as:

$$Q_{LH} = \begin{pmatrix} 1 & 0 & 0 & c \\ 0 & 1 & 0 & c \\ 0 & 0 & 1/2 & c/2 \\ 0 & 0 & 0 & 1/6 + c/3 \end{pmatrix}$$

The corresponding structure 500 (FIG. 5a) is similar to the quasi-Newton structure 400 in FIG. 4. Only the additional return loops 410_1 to 410_4 differ in that they are weighted by the combination parameter c. In practice, such a weighting is carried out, for example, via a multiplier 520_1, here on feedback loop 410_1, which happens to be a section common to the different feedback loops 410_1 to 410_4. Moreover, an operand of the multiplier 520_1 is proportional to the combination parameter c.

Specifically, structure 500 appears as a modified Newton structure that implements:
- the Newton structure 100 when the combination parameter c is 0; and
- the quasi-Newton structure 400 when the combination parameter c is 1.

Figure 5C:
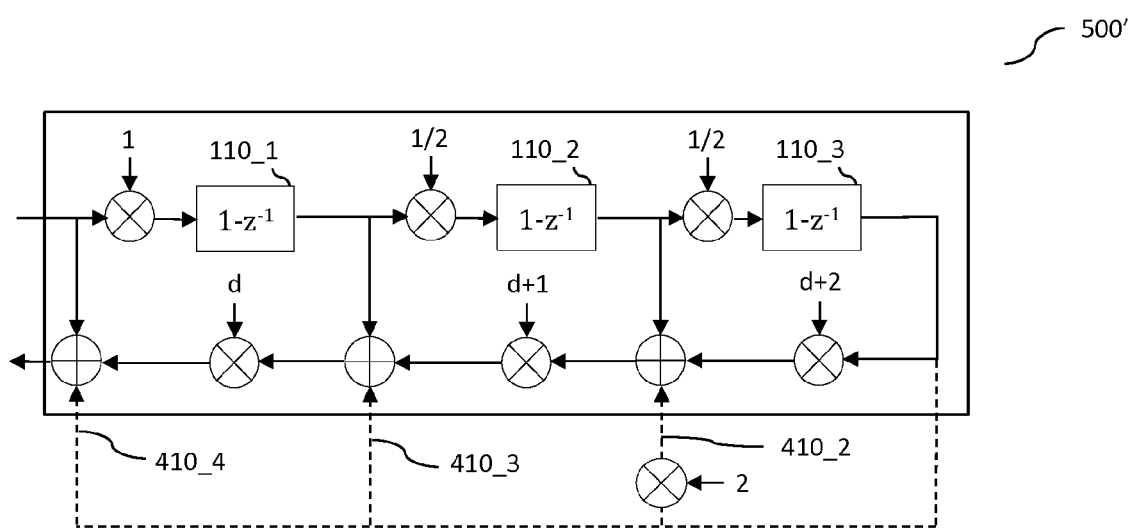
FIG. 5c illustrates a digital fractional delay device comprising an interpolation filter resulting from a linear combination of the filters of FIGS. 1 and 4 according to another embodiment of the invention.

A digital fractional delay device comprising an interpolation filter resulting from a linear combination of the filters of FIGS. 1 and 4 according to another embodiment of the invention is now described in relation to FIG. 5c.

In particular, the interpolation filter according to this embodiment implements a third-order polynomial interpolation, of which a transfer function $H_{LH,1/4}^d(Z^{-1})$ in the Z-transform domain corresponds to the transfer function $H_{LH}^d(Z^{-1})$ of the filter in FIG. 5a when the combination parameter c is set to the value ¼.

From the transfer function $H_{LH}^d(Z^{-1})$ obtained above in relation to FIG. 5a, the transfer function $H_{LH,1/4}^d(Z^{-1})$ is thus expressed as:

$$H_{LH,1/4}^d(Z^{-1}) = H_{LH}^d(Z^{-1})|_{c=1/4} = H_L^d(Z^{-1}) + \frac{1}{4}(H_H^d(Z^{-1}) - H_L^d(Z^{-1}))$$

Equally, the matrix $Q_{LH,1/4}$, representing the function $H_{LH,1/4}^d(Z^{-1})$ in the transform base, is expressed as:

$$Q_{LH,1/4} = Q_{LH}|_{c=1/4} = Q_L + \frac{1}{4}(Q_H - Q_L)$$

or, from the expression of the matrix $Q_{LH}$ obtained above in relation to FIG. 5a:

$$Q_{LH,1/4} = \begin{pmatrix} 1 & 0 & 0 & 1/4 \\ 0 & 1 & 0 & 1/4 \\ 0 & 0 & 1/2 & 1/8 \\ 0 & 0 & 0 & 1/4 \end{pmatrix}$$

It thus appears that the corresponding structure 500' is not only a simple copy of the structure 500 of the filter in FIG. 5a in the particular case where c=¼. Indeed, the structure of the terms of the matrix $Q_{LH}$ allows for arithmetic simplifications when the parameter c has a particular fixed numerical value. The corresponding implementation then benefits from the simplifications in question. In the present case where c=¼, the structure 500' corresponding to the matrix $Q_{LH,1/4}$ as defined above implements a modified Newton structure comprising only part of the Newton structure 100. In particular, some operands are different from those in the Newton structure 100. Depending on the considered values of the combination parameter c the implementation of an interpolation filter according to the invention is thus particularly effective when the parameter in question c is fixed.

Figure 6A:
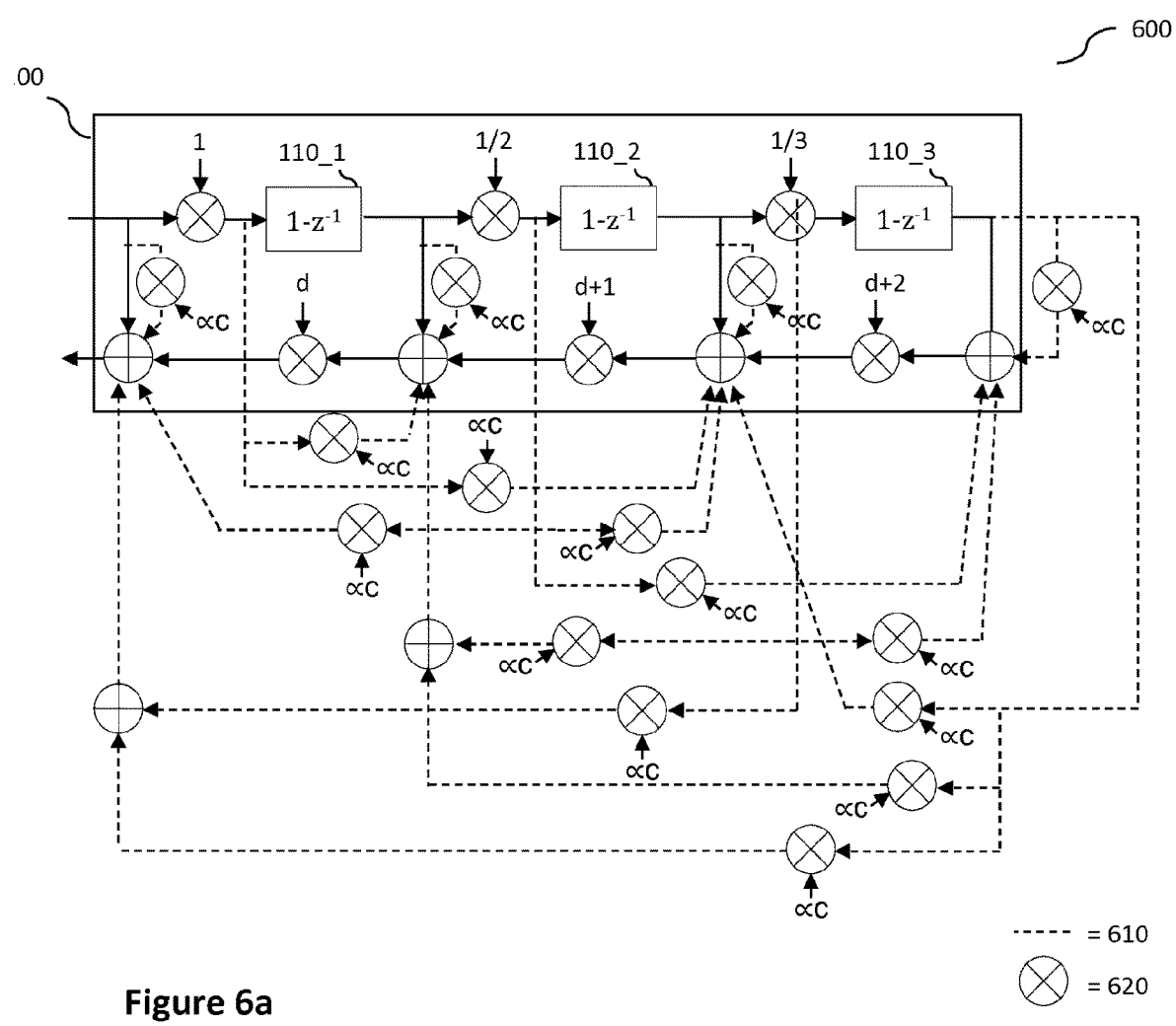
FIGS. 6a and 6b illustrate a digital fractional delay device comprising an interpolation filter according to another embodiment of the invention.
Figure 6B:
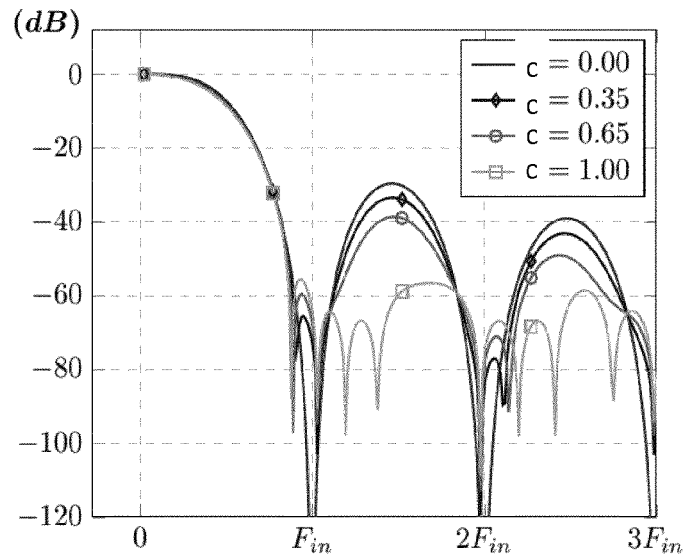

A digital fractional delay device comprising an interpolation filter according to one embodiment of the invention is now described in relation to FIGS. 6a and 6b.

In particular, the interpolation filter according to this embodiment implements a third-order polynomial interpolation including a transfer function in the Z-transform domain, $H_{LP}^d(Z^{-1})$, expressed as a linear combination between:
- the transfer function $H_L^d(Z^{-1})$ representing the Lagrange interpolation filter of FIG. 1 implemented according to the Newton structure 100; and
- a transfer function $H_P^d(Z^{-1})$ representing a filter implementing a personalised polynomial interpolation.

For example, the transfer function $H_P^d(Z^{-1})$ is generated using the filter synthesis method described in the thesis of Hunter, M. T. *"Design of Polynomial-based Filters for Continuously Variable Sample Rate Conversion with Applications in Synthetic Instrumentation and Software Defined Radio"*, University of Central Florida Orlando, Florida, 2008 to verify the following constraints:

- an impulse response composed of four polynomial functions;
- a bandwidth extending over the band [0; 0.2$F_s$], with $F_s=1/T_s$ the sampling frequency of the input signal to be interpolated;
- an attenuation band for frequencies higher than $F_s$.

Furthermore, the parameters $W_{pass}$ and $W_{stop}$ of the above-mentioned synthesis method are set at 25 so as to give the same importance to the optimisation of the transfer function of the filter in question within its bandwidth and outside its bandwidth. This provides both a good flatness in the bandwidth and a good attenuation of the side lobes. As shown in FIG. 6b, the resulting transfer function has a side lobe level that is lower than the main lobe by 60 dB.

Based on these constraints, the synthesis method directly provides an expression for the corresponding symmetric Farrow matrix $P_p$:

$$P_P = \begin{pmatrix} 0.5127049464 & -1.2328513307 & 1.2328513307 & -0.5127049464 \\ 0.2728275037 & -0.2791909529 & -0.2791909529 & 0.2728275037 \\ -0.0548684879 & 1.1598793883 & -1.1598793883 & 0.0548684879 \\ -0.0405493896 & 0.5649430472 & 0.5649430472 & -0.0405493896 \end{pmatrix}$$

Further, on the basis of the expressions of the matrices $(T_d^T)^{-1}$ and $T_z^{-1}$ given respectively by equations (Eq-4) and (Eq-5), the matrix $Q_p$ obtained by equation (Eq-2) is expressed in this case as:

$$Q_P = \begin{pmatrix} 1.0201517939 & 0.9929475376 & -0.8664743440 & 1.0747639686 \\ -0.0254537968 & 2.0255610229 & -0.9087972112 & 1.0657675806 \\ -0.0127268984 & 0.4769856106 & 0.0813962953 & 0.4962299160 \\ 0.0000000000 & 0.3052635087 & -0.3052635087 & 0.5127049465 \end{pmatrix}$$

In this embodiment, the transfer function $H_{LP}^d(Z^{-1})$ is expressed as:

$$H_{LP}^d(Z^{-1}) = H_L^d(Z^{-1}) + c(H_P^d(Z^{-1}) - H_L^d(Z^{-1}))$$

Hence, the magnitude of the transfer function $H_{LP}^d(Z^{-1})$ of the filter according to the invention varies between the amplitude of the transfer function $H_L^d(Z^{-1})$ of the third-order Lagrange interpolation for c=0 and that of the transfer function $H_P^d(Z^{-1})$ of the personalised interpolation of the same order for c=1 as shown in FIG. 6b. Moreover, a value of c greater than 1 can also be used.

Equivalently, it is obtained by linearity of the equation (Eq-3) that the matrix $Q_{LP}$, representing the function $H_{LP}^d(Z^{-1})$ in the transform base, expresses itself as:

$$Q_{LP} = Q_L + c(Q_P - Q_L)$$

From the expression of the matrix $Q_L$ obtained above in relation to FIG. 1, the matrix $Q_{LP}$ is expressed as:

$$Q_{LP} = \begin{pmatrix} 1+c \times dq_{11} & c \times q_{12} & c \times q_{21} & c \times q_{14} \\ c \times q_{21} & 1+c \times dq_{22} & c \times q_{21} & c \times q_{24} \\ c \times q_{31} & c \times q_{32} & 1/2 + c \times dq_{33} & c \times q_{34} \\ 0 & c \times q_{42} & c \times q_{43} & 1/6 + c \times dq_{44} \end{pmatrix}$$

with $q_{i,j}$ the elements of the matrix $Q_p$.

In particular, the corresponding structure 600 (FIG. 6a) thus comprises:

- the Newton structure 100, implementing the Lagrange interpolation filter described in relation to FIG. 1; and
- fifteen additional return loops (dotted arrows in FIG. 6a generally referenced 610 for greater clarity) between an output of a delay line (of the form $(1-Z^{-1})^k$) of the Newton structure 100 and the output of the Newton structure 100. In practice, such loops are made either directly to the output of the Newton structure 100, or indirectly, i.e. via other elements of the initial feedback loop of the Newton structure 100.

Specifically, the fifteen additional 610 return loops correspond to the fifteen elements of the matrix $Q_{LP}$ that are weighted by the combination parameter c. In practice, such weighting is performed by multipliers (also dotted in FIG. 6a and generally referenced 620 for greater clarity) on the corresponding 610 return loops. Moreover, an operand of the multipliers 620 is proportional to the combination parameter c.

Figure 7A:
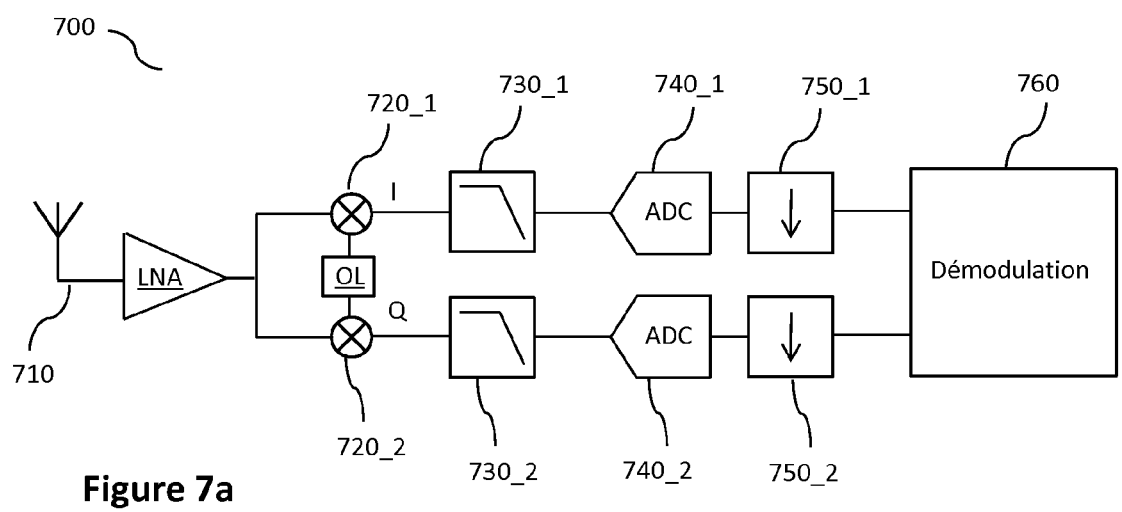
Figure 7B:
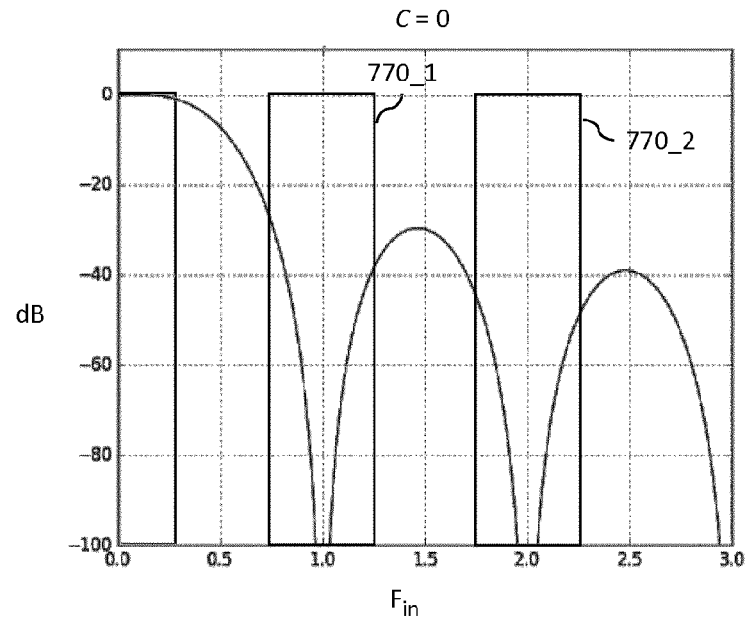
Figure 7C:
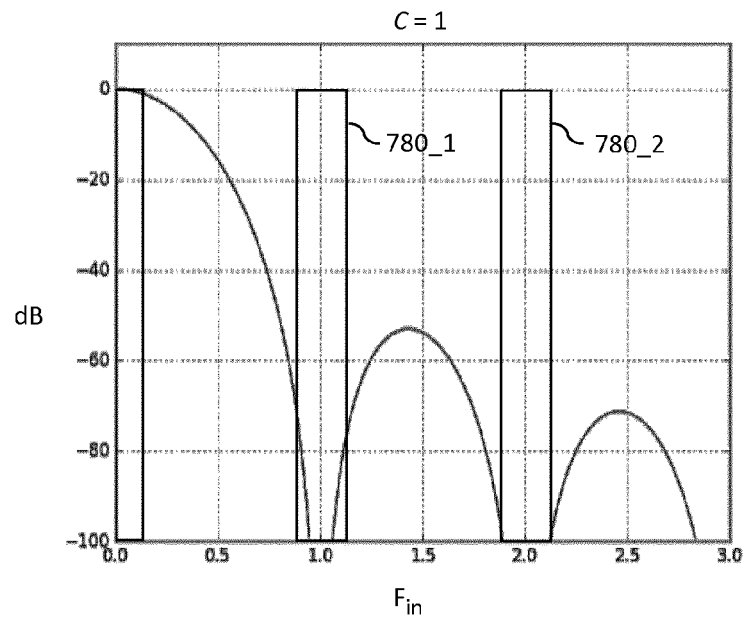

A multi-mode radio frequency 700 receiving equipment comprising two sampling rhythm changing devices 730_1, 730_2 each implementing the digital fractional delay device in FIG. 3a is now described in relation to FIGS. 7a, 7b and 7c.

More specifically, the receiving equipment 700 includes an antenna 710 delivering the radio frequency signal to a low noise amplifier LNA. The low noise amplifier LNA delivers the amplified radio frequency signal to two mixers 720_1, 720_2 sequenced by two signals in quadrature delivered by a local oscillator OL. The two baseband I and Q signals thus obtained are filtered by analogue filters 730_1, 730_2 before being sampled at a sampling frequency of $F_{in}$ by two analogue-to-digital converters 740_1, 740_2.

The I and Q signals sampled at the sampling frequency $F_{in}$ are then processed respectively by two sampling rhythm changing devices 750_1, 750_2 each implementing the interpolation filter of FIG. 3a in order to deliver I and Q signals sampled at the sampling frequency $F_{out}$ more suitable for demodulation by the block 760.

Moreover, the receiving equipment 700 is configured to operate according to two reception modes. In a first mode, the receiving equipment 700 receives, for example, an LoRa® signal with a bandwidth of 125 kHz. In a second mode, the receiving equipment 700 receives, for example, a SigFox® signal with a bandwidth of 100 Hz.

To do this, devices 750_1, 750_2 each implement the filter in FIG. 3a whose transfer function $H_{LS}^d(Z^{-1})$ can be set between the transfer function $H_L^d(Z^{-1})$ of the third-order Lagrange interpolation and that of the transfer function $H_S^d(Z^{-1})$ of the same order Spline interpolation according to the combination parameter c.

When c=0, the Lagrange-type transfer function is adapted to the attenuation of the first 770_1 and second 770_2 replicas of the LoRa Signal® sampled at the frequency $F_{in}$ while preserving the useful signal centred on the zero frequency (FIG. 7b).

Conversely, when c=1, the Spline transfer function is better adapted to the attenuation of the first 780_1 and second 780_2 replicas of the SigFox® signal sampled at the frequency $F_{in}$ while preserving the useful signal centred on the null frequency (FIG. 7c). Indeed, the SigFox® signal being narrower-band than the LoRa®, a more aggressive filtering of the replicas can be considered while preserving the useful signal in the filter bandwidth.

In this manner, the anti-aliasing filtering function of the 730_1, 730_2 devices is obtained in a simple and configurable way in order to address both standards.

Moreover, the delay d is variable here and can be reprogrammed on-the-fly between two samples of the input signal in order also to enable the change of the sampling frequency from $F_{in}$ to $F_{out}$.

Similarly, the parameter c has the values 0 or 1 here. In this way, the transfer function $H_{LS}^d(Z^{-1})$ is switched between the transfer function $H_L^d(Z^{-1})$ and the transfer function $H_S^d(Z^{-1})$ depending on the reception mode considered.

In other embodiments addressing other applications, the parameter d is static and only a delay to the sampling instants is obtained. In this case $F_{out}=F_{in}$.

In still other embodiments, the parameter c is made variable and reprogrammable on-the-fly over a range of values in order to enable a continuous variation of the amplitude of the transfer function of the filter according to the invention between the amplitude of the first transfer function $H_1^d(Z^{-1})$ and the amplitude of the second transfer function $H_2^d(Z^{-1})$.

In still other embodiments, the parameter c is static and has a predetermined value such that the amplitude of the transfer function of the filter according to the invention results from the desired linear combination between the amplitude of the first transfer function $H_1^d(Z^{-1})$ and the amplitude of the second transfer function $H_2^d(Z^{-1})$.

The various above-mentioned structures 100, 200, 300, 400, 500, 600 of digital filtering devices according to the invention may be implemented indifferently on a reprogrammable computing machine (a PC computer, a DSP processor or a microcontroller) executing a program comprising a sequence of instructions, or on a dedicated computing machine (for example a set of logic gates such as an FPGA or an ASIC, or any other hardware module) in order to implement digital interpolation according to the invention.

In the case where the above-mentioned filtering structures are realised with a reprogrammable computing machine, the corresponding program (i.e. the sequence of instructions) can be stored in a removable (such as, for example, a floppy disk, CD-ROM or DVD-ROM) or non-removable (a memory, volatile or not) storage medium, this storage medium being partially or totally readable by a computer or a processor. At initialisation, the code instructions of the computer program are for example loaded into a volatile memory before being executed by the processor of the processing unit.

Figure 8:
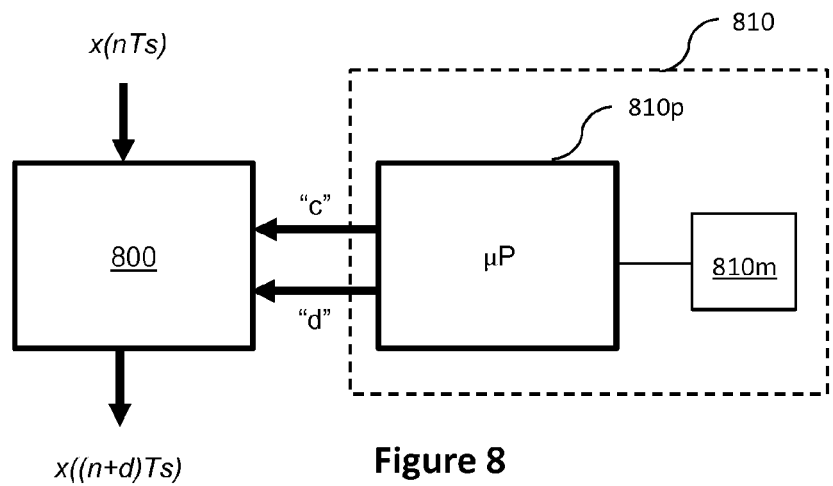
FIG. 8 illustrates a device for controlling, according to one embodiment of the invention, a digital device with a fractional delay according to the invention.

A device 810 for controlling a digital fractional delay device 800 according to the invention is now described in relation to FIG. 8.

For example, the digital device 800 is one of the digital devices in FIG. 3a, 5b or 6a.

According to the embodiment shown in FIG. 8, a microcontroller 810p statically programs the digital device 800, i.e. prior to processing the samples $x(nT_s)$ of the input signal x(t) by the digital device 800. Thus, the digital device 800 delivers the output samples approximating the input signal at the sampling instants of the form $(n+d)T_s$ after processing by using the following parameters previously received from the microcontroller 810p:

the combination parameter c; and
the real number d defining fractional sampling instants.

Table 1 below gives examples of parameter c values for some LoRa® or Sigfox® signals.

TABLE 1

Examples of parameter c values to be applied to the digital device in FIG. 3a to process a LoRa ® or Sigfox ® signal.

| Standard | Parameter c value |
| --- | --- |
| LoRa ® 250 kHz | 0.00 |
| LoRa ® 125 kHz | 0.25 |
| Sigfox ® 100 kHz | 1.00 |

According to the embodiment shown in FIG. 8, such values of the parameter c are stored in a memory 810m of the control device 810 so that the microcontroller 810p transmits the appropriate value to the digital device 800 before receiving the corresponding LoRa® or Sigfox® signal. In particular, the values for the parameter c given in Table 1 apply when the digital device 800 corresponds to the digital device of FIG. 3a.

Figure 9:
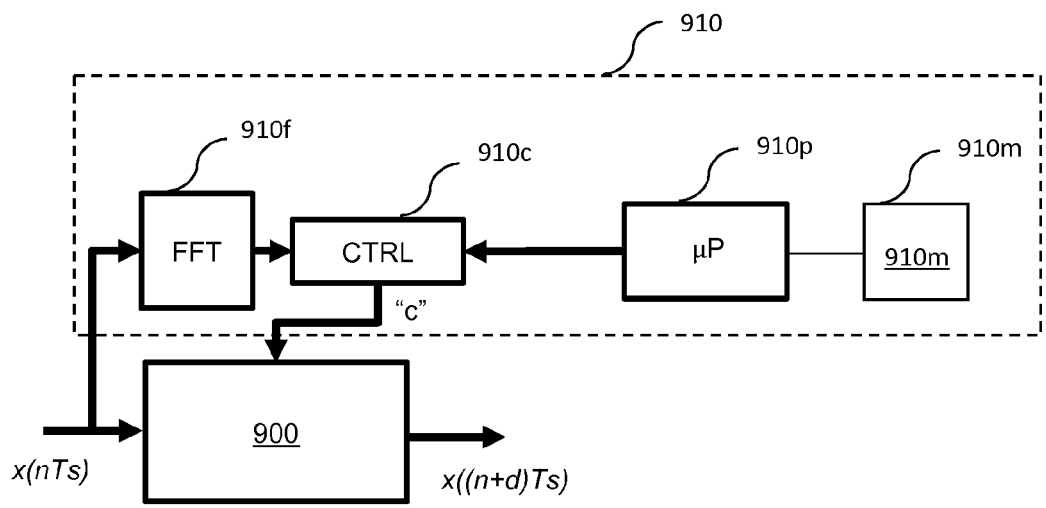
FIG. 9 illustrates a device for controlling, according to another embodiment of the invention, a digital device with a fractional delay according to the invention.

Another device 910 for controlling a digital fractional delay device 900 according to the invention is now described in relation to FIG. 9.

For example, the digital device 900 is one of the digital devices in FIG. 3a, 5b or 6a.

According to the embodiment shown in FIG. 9, a control device 910 dynamically controls the digital device 900, i.e. on-the-fly during the processing of the samples $x(nT_s)$ of the input signal x(t) by the digital device 900. Thus, the digital device 900 delivers output samples approximating the input signal at sampling instants of the form $(n+d)T_s$ after processing via the implementation of the parameter c received dynamically from the controller 910c.

More specifically, the controller 910c determines the parameter c suitable for the processed signal based on all or some of the following information:

the spectrum characteristics (useful signal band, existence of blocking signals, etc.) of the input signal x(t). The spectrum in question is, for example, delivered by the spectral analysis block 910f (implementing for example a discrete Fourier transform of the samples $x(nT_s)$ of the input signal);

the real number d defining fractional sampling instants; and the configuration of other signal processing modules arranged either upstream or downstream of the digital device 900. For example, a filter module (e.g. an FIR filter) placed upstream of the digital device 900 can be used to implement pre-distortion of the signal having to be processed by the digital device 900. In this manner, it is possible to consider more aggressive filtering at the level of the digital device 900. Indeed, such a more aggressive filtering is at the expense of reducing the width of the filter bandwidth included in the digital device 900. However, the above-mentioned pre-distortion can in this case compensate for all or part of the distortion related to the reduction of the bandwidth in question. For example, when the digital device 900 corresponds to the digital device in FIG. 3a, such pre-distortion makes it possible, for example, to increase the value of the linear combination parameter c so as to obtain more aggressive out-of-band filtering (i.e. which is closer to Spline filtering than to Lagrange filtering) and thus improve the rejection of the side lobes while preserving the quality of the useful signal thanks to the upstream pre-distortion module. Alternatively, if in a particular reception mode (e.g. during reception of a signal according to another standard), the upstream pre-distortion module can no longer be used for a given reason, the parameter c is adjusted again by the control device 910 to take into account the absence of pre-distortion on the signal to be processed by the digital device 900. Similarly, the control device 910 can take into account the possible presence of another module (e.g. an FIR filter) placed downstream of the digital device 900 in order to determine the parameter c.

Further, in the embodiment shown in FIG. 9 the controller 910c is itself controlled by a microcontroller 910p on the basis of parameters and/or code instructions stored in a memory 910m.

The invention claimed is:

1. A digital interpolation filtering device with fractional delay of a signal x(t), comprising:
   a signal input to receive a series of input samples of a signal x(t) taken at sampling instants of the form $nT_s$, with n being an integer, $T_s$ being a sampling period;
   an output which delivers a series of output samples approximating the signal x(t) at sampling instants of the form $(n+d)T_s$ based on the series of input samples of said signal x(t) with d being a real number defining the sampling instants;
   a removable or non-removable memory for storing a sequence of instructions; and
   a computing machine, which is connected to receive the series of input samples from the input and deliver the series of output samples to the output, and which is configured to execute the sequence of instructions to implement:
      a modified Newton structure comprising:
      a Newton structure implementing a first transfer function $H_1^d(Z^{-1})$ representing a Lagrange-polynomial interpolation of said series of input samples; and
      at least one additional feedback loop between:
         an output of a delay line of said Newton structure; and
         an output of said Newton structure;
      another structure implementing a second transfer function $H_2^d(Z^{-1})$ representing another polynomial interpolation of said series of input samples implemented, said other structure comprising at least said Newton structure,
   wherein said digital interpolation filtering device has a transfer function in the Z-transform domain, $H_c^d(Z^{-1})$, which comprises a linear combination between the first transfer function and the second transfer function and is a function of at least one real combination parameter c, and
   wherein said at least one additional feedback loop comprises at least one multiplier block, an operand of said at least one multiplier block being proportional to said combination parameter c; and
   at least one real combination parameter input to receive the at least one real combination parameter c and connected to apply the at least one real combination parameter c to the multiplier block, wherein a value of the at least one real combination parameter c received at the at least one real combination parameter input determines a sampling frequency of the series of output samples approximating the signal x(t) delivered by the digital interpolation filtering device at the output.

2. The digital interpolation filtering device according to claim 1, wherein said linear combination of said first $H_1^d(Z^{-1})$ and second $H_2^d(Z^{-1})$ transfer functions is expressed as:
   $$H_c^d(Z^{-1}) = H_1^d(Z^{-1}) + c(H_2^d(Z^{-1}) - H_1^d(Z^{-1})).$$

3. The digital interpolation filtering device according to claim 1, wherein said other structure is a quasi-Newton structure.

4. The digital interpolation filtering device according to claim 3, said other polynomial interpolation of said series of input samples belongs to the group consisting of:
   a Spline polynomial interpolation of said series of input samples; and
   a Hermite polynomial interpolation of said series of input samples.

5. The digital interpolation filtering device according to claim 1, wherein:
   said first transfer function $H_1^d(Z^{-1})$ is expressed in a base of polynomials in $Z^{-1}$ corresponding to an implementation according to said Newton structure; and
   said second transfer function $H_2^d(Z^{-1})$ is expressed at least in part in said polynomial base in $Z^{-1}$.

6. The digital interpolation filtering device according to claim 5, wherein said real number d is included in the segment $[-N/2; 1-N/2[$, the order of said polynomial Lagrange interpolation being equal to N−1 with N an integer,
   and wherein said second transfer function $H_2^d(Z^{-1})$ is expressed as:

$$H_2^d(Z^{-1}) = \sum_{n=1}^{N} q_{n,1}(1-Z^{-1})^{n-1} + \sum_{n=1}^{N}\sum_{m=2}^{N} q_{n,m}\left[(1-Z^{-1})^{n-1}\prod_{i=0}^{m-2}(d+i)\right]$$

with $q_{n,m}$ elements of a matrix Q of N rows and N columns, said matrix Q expressed as a product of matrices:

$$Q = (T_d^T)^{-1} P T_z^{-1}$$

where:
   $T_d$ a matrix of N rows and N columns transforming a vector $\vec{\mu} = [1, \mu, \mu^2, \ldots, \mu^{N-1}]$ into a vector $\vec{d} = [1, d, d(d+1), \ldots, \prod_{i=0}^{N-2}(d+i)]$, where $\mu = d+(N-1)/2$;
   $T_Z$ a matrix of N rows and N columns transforming a vector $\vec{Z} = [1, z^{-1}, z^{-2}, \ldots, z^{-(N-1)}]$ into a vector $\vec{\nabla Z} = [1, (1-z^{-1}), (1-z^{-1})^2, \ldots, (1-z^{-1})^{N-1}]$;
   P a symmetric Farrow matrix representing said other polynomial interpolation, said symmetric Farrow matrix P having N rows and N columns and representing a transfer function in the Z-transform domain, $H_2^\mu(Z^{-1})$ being expressed as:

$$H_2^\mu(Z^{-1}) = \sum_{j=1}^{N} \beta_j(\mu) z^{-(j-1)} = \sum_{j=1}^{N}\left(\sum_{i=1}^{N} p_{i,j}\mu^{i-1}\right) z^{-(j-1)}$$

with $p_{i,j}$, a row index element i and a column index element j of said symmetric Farrow matrix P, said N polynomials $\beta_j(\mu)$ verifying $\beta_j(\mu) = +\beta_{N-j+1}(\mu)$ or $\beta_j(\mu) = \beta_{N-j+1}(\mu)$.

7. The digital interpolation filtering device according to claim 6, wherein said matrix $T_d$ is expressed as a product of matrices $T_d^2 T_d^1$, with $T_d^1$ and $T_d^2$ two matrices of N rows and N columns, at least one element, $T_d^1[i,j]$, of row index i and column index j, of said matrix $T_d^1$, being proportional to $$\binom{i-1}{j-1}\left(-\frac{N-1}{2}\right)^{i-j}, \text{where } \binom{i-1}{j-1}$$

a binomial coefficient read j−1 among i−1, at least one element, $T_d^2[i,j]$, of row index i and column index j, of said matrix $T_d^2$, being proportional to a Stirling number of the first kind $S_{j-1}^{(i-1)}$.

8. The digital interpolation filtering device according to claim 6, wherein at least one element, $T_z[i,j]$, of row index i and column index j, of said matrix $T_z$, is proportional to $$\binom{i-1}{j-1}(-1)^{j+1} \text{ with } \binom{i-1}{j-1}$$

a binomial coefficient read j−1 among i−1.

9. The digital interpolation filtering device according to claim 1, wherein said real number d and/or said combination parameter c is/are variable.

10. The digital interpolation filtering device according to claim 1, wherein said other structure is a quasi-Newton structure and said modified Newton structure implements:
said Newton structure when said combination parameter c is 0; and
said quasi-Newton structure when the combination parameter c is 1.

11. The digital interpolation filtering device according to claim 1, wherein said combination parameter c is fixed.

12. A digital device for changing a sampling frequency of a signal x(t), comprising:
at least one digital interpolation filtering device with fractional delay of the signal x(t), comprising:
a signal input to receive a series of input samples of a signal x(t) taken at sampling instants of the form $nT_s$, with n being an integer, $T_s$ being a sampling period;
an output which delivers a series of output samples approximating the signal x(t) at sampling instants of the form $(n+d)T_s$ based on the series of input samples of said signal x(t) with d being a real number defining the sampling instants;
a removable or non-removable memory for storing a sequence of instructions;
a computing machine, which is connected to receive the series of input samples from the input and deliver the series of output samples to the output, and which is configured to execute the sequence of instructions to implement:
a Newton structure implementing a first transfer function $H_1^d(Z^{-1})$ representing a Lagrange-polynomial interpolation of said series of input samples; and
another structure implementing a second transfer function $H_2^d(Z^{-1})$ representing another polynomial interpolation of said series of input samples, said other structure comprising at least said Newton structure, and
wherein said at least one digital interpolation filtering device has a transfer function in the Z-transform domain, $H_c^d(Z^{-1})$, which comprises a linear combination between the first transfer function and the second transfer function and is a function of at least one real combination parameter c; and
at least one real combination parameter input to receive the at least one real combination parameter c and connected to apply the at least one real combination parameter c to the at least one digital interpolation filtering device, wherein a value of the at least one real combination parameter c received at the at least one real combination parameter input determines a sampling frequency of the series of output samples approximating the signal x(t) delivered by the digital interpolation filtering device at the output.

13. The digital device according to claim 12, wherein said digital device comprises:
a real number input to receive the real number d and connected to apply the real number d to the at least one digital interpolation filtering device.

14. Equipment comprising:
an antenna delivering a radio-frequency signal x(t);
at least one processing element, which is connected to receive the radiofrequency signal x(t) from the antenna and generates a series of input samples of the signal x(t) taken at sampling instants of the form $nT_s$, with n being an integer, $T_s$ being a sampling period;
at least one digital interpolation filtering device with fractional delay for changing a sampling frequency of the radio-frequency signal x(t), the at least one digital interpolation filtering device comprising:
a signal input connected to receive the series of input samples of the signal x(t) from the at least one processing element;
an output which delivers a series of output samples approximating the signal x(t) at sampling instants of the form $(n+d)T_s$ based on the series of input samples of said signal x(t) with d a real number defining the sampling instants;
a removable or non-removable memory for storing a sequence of instructions;
a computing machine, which is connected to receive the series of input samples from the input and deliver the series of output samples to the output, and which is configured to execute the sequence of instructions to implement:
a Newton structure implementing a first transfer function $H_1^d(Z^{-1})$ representing a Lagrange-polynomial interpolation of said series of input samples; and
another structure implementing a second transfer function $H_2^d(Z^{-1})$ representing another polynomial interpolation of said series of input samples, said other structure comprising at least said Newton structure,
wherein said at least one digital interpolation filtering device has a transfer function in the Z-transform domain, $H_c^d(Z^{-1})$, which comprises a linear combination between the first transfer function and the second transfer function and is a function of at least one real combination parameter c; and
at least one real combination parameter input to receive the at least one real combination parameter c and connected to apply the at least one real combination parameter c to the at least one digital interpolation filtering device, wherein a value of the at least one real combination parameter c received at the at least one real combination parameter input determines a sampling frequency of the series of output samples approximating the signal x(t) delivered by the digital interpolation filtering device at the output.

15. A system for processing an input signal, comprising:
a digital device for changing a sampling frequency of a signal x(t), comprising:
at least one digital interpolation filtering device with fractional delay of the signal x(t), comprising:

a signal input to receive a series of input samples of a signal x(t) taken at sampling instants of the form $nT_s$, with n being an integer, $T_s$ being a sampling period;

an output which delivers a series of output samples approximating the signal x(t) at sampling instants of the form $(n+d)T_s$ based on the series of input samples of said signal x(t) with d being a real number defining the sampling instants;

a removable or non-removable memory for storing a sequence of instructions;

a computing machine, which is connected to receive the series of input samples from the input and deliver the series of output samples to the output, and which is configured to execute the sequence of instructions to implement:

a Newton structure implementing a first transfer function $H_1^d(Z^{-1})$ representing a Lagrange-polynomial interpolation of said series of input samples; and another structure implementing a second transfer function $H_2^d(Z^{-1})$ representing another polynomial interpolation of said series of input samples, said other structure comprising at least said Newton structure, and wherein said at least one digital interpolation filtering device has a transfer function in the Z-transform domain, $H_c^d(Z^{-1})$, which comprises a linear combination between the first transfer function and the second transfer function and is a function of at least one real combination parameter c; and at least one real combination parameter input to receive the at least one real combination parameter c and connected to apply the at least one real combination parameter c to the at least one digital interpolation filtering device, wherein a value of the at least one real combination parameter c received at the at least one real combination parameter input determines a sampling frequency of the series of output samples approximating the signal x(t) delivered by the digital interpolation filtering device at the output; and a controller to program the digital interpolation filtering device, wherein said controller comprises:

a non-transitory computer-readable memory storing at least one value of the at least one combination parameter c to be applied to the digital interpolation filtering device; and a microcontroller configured to transmit the at least one value of the at least one combination parameter c to the at least one real combination parameter input of the digital interpolation filtering device and thereby determine the sampling frequency of the series of output samples delivered by the digital interpolation filtering device, wherein the digital interpolation filtering device is configured to receive the at least one value and process the series of input samples of the signal x(t) by using the received at least one value.

16. The system according to claim 15, wherein the non-transitory computer-readable memory of the controller further stores a value of the real number d; the microcontroller is configured to transmit the value of the real number d to a further input of the digital interpolation filtering device; and the digital interpolation filtering device is configured to receive the real number d and process the series of input samples of the signal x(t) by using the received value of the real number d.

17. The system according to claim 15, wherein:

the controller further comprises an analyzer having an input connected to receive the series of input samples of the signal x(t) and is configured to deliver spectrum characteristics of the series of input samples; and the microcontroller is configured to determine the value of the at least one combination parameter c suitable for the input signal x(t) at least based on the spectrum characteristics delivered by the analyzer, a value of the real number d and configuration of at least one signal processing module of the system arranged upstream or downstream of the digital device.

* * * * *